US 10,184,993 B2

(12) United States Patent
Ide et al.

(10) Patent No.: US 10,184,993 B2
(45) Date of Patent: Jan. 22, 2019

(54) MAGNETOMETRIC SENSOR AND CURRENT SENSOR

(71) Applicant: ALPS ELECTRIC CO., LTD., Ota-ku, Tokyo (JP)

(72) Inventors: Yosuke Ide, Tokyo (JP); Masamichi Saito, Tokyo (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 519 days.

(21) Appl. No.: 15/018,989

(22) Filed: Feb. 9, 2016

(65) Prior Publication Data

US 2016/0238675 A1 Aug. 18, 2016

(30) Foreign Application Priority Data

Feb. 12, 2015 (JP) ................................. 2015-024891
Feb. 24, 2015 (JP) ................................. 2015-034532

(51) Int. Cl.
G01R 33/09 (2006.01)
H01L 43/02 (2006.01)
H01L 43/08 (2006.01)
H01L 43/10 (2006.01)

(52) U.S. Cl.
CPC .......... G01R 33/093 (2013.01); G01R 33/098 (2013.01); H01L 43/02 (2013.01); H01L 43/08 (2013.01); H01L 43/10 (2013.01)

(58) Field of Classification Search
CPC ..... G01R 33/093; G01R 33/098; H01L 43/02; H01L 43/08; H01L 43/10
USPC .......... 324/200, 300, 301, 319, 205, 207.21, 324/210–219, 228, 232, 244–263, 500, 324/529, 750.12, 750.21, 754.17, 754.29; 360/75, 112, 126, 318, 66, 313, 324, 360/324.11, 252; 428/848, 220, 810–829
See application file for complete search history.

(56) References Cited

U.S. PATENT DOCUMENTS 5,969,523 A * 10/1999 Chung ................... B82Y 10/00
324/252
6,324,029 B1 * 11/2001 Matsubara ............. B82Y 10/00
324/252

FOREIGN PATENT DOCUMENTS

JP 2012-185044 9/2012

* cited by examiner

Primary Examiner — Melissa Koval
Assistant Examiner — Trung Nguyen
(74) Attorney, Agent, or Firm — Hunton Andrews Kurth LLP

(57) ABSTRACT

A magnetometric sensor comprises a magnetoresistance effect element having a sensitivity axis in a specific direction; including a fixed magnetic layer, a nonmagnetic material layer, and a free magnetic layer stacked in this order on a substrate; and including a first antiferromagnetic layer on the free magnetic layer on the opposite side to the side facing the nonmagnetic material layer to cause an exchange coupling bias between the first antiferromagnetic layer and the free magnetic layer and align the magnetization direction of the free magnetic layer in a prescribed direction in a state of permitting variation in magnetization. The free magnetic layer includes a first free magnetic sub-layer, a misfit-reducing sub-layer for decreasing the lattice mismatch of the free magnetic layer with the first antiferromagnetic layer, and a second free magnetic sub-layer ferromagnetically coupled to the first free magnetic sub-layer in this order from the first antiferromagnetic layer side.

20 Claims, 8 Drawing Sheets

MAGNETOMETRIC SENSOR AND CURRENT SENSOR

CLAIM OF PRIORITY

This application contains subject matter related to and claims the benefit of Japanese Patent Application Nos. 2015-024891 filed on Feb. 12, 2015 and 2015-034532 filed on Feb. 24, 2015, the entire contents of which are incorporated herein by reference.

BACKGROUND OF THE DISCLOSURE

1. Field of the Disclosure

The present disclosure relates to a magnetometric sensor and a current sensor comprising the magnetometric sensor.

2. Description of the Related Art

In the field of such as motor drive technologies of electric vehicles and hybrid cars, relatively large currents are used, and contactless current sensors capable of measuring large currents are in demand. In existing such current sensors, magnetometric sensors detecting induced magnetic fields from currents to be measured are employed. Examples of the magnetism detecting element for the magnetometric sensor include magnetoresistance effect elements such as giant magnetoresistance (GMR) elements.

The GMR element has a layered structure, as the basic structure, composed of a fixed magnetic layer and a free magnetic layer stacked with a nonmagnetic material layer interposed therebetween. In the fixed magnetic layer, the direction of magnetization is fixed in one direction by the exchange coupling bias due to a layered structure of an antiferromagnetic layer and a ferromagnetic layer or by RKKY interaction (indirect exchange interaction) due to a self-pinned structure composed of two ferromagnetic sub-layers disposed with a nonmagnetic intermediate sub-layer interposed therebetween. The free magnetic layer can change the direction of magnetization according to the external magnetic field.

In a current sensor employing a magnetometric sensor comprising a GMR element, an application of an induced magnetic field from the current to be measured to the GMR element changes the direction of magnetization of the free magnetic layer. The electrical resistivity of the GMR element is changed according to the relative angle between this magnetization direction of the free magnetic layer and the magnetization direction of the fixed magnetic layer. Accordingly, the magnetization direction of the free magnetic layer can be detected by measuring this electrical resistivity. Furthermore, the magnitude and the direction of a current providing an induced magnetic field can be determined based on the direction of magnetization detected with the magnetometric sensor.

Incidentally, some electric vehicles and hybrid cars control the driving of the motor based on the value of a current, and some electric vehicles and hybrid cars adjust the process of controlling the battery according to the value of a current flowing into the battery. Accordingly, the current sensor employing a magnetometric sensor is required to increase the measurement accuracy of the magnetometric sensor such that the current value can be precisely detected.

Enhancement of the measurement accuracy of a magnetometric sensor requires, for example, a reduction in offset, a reduction in the variation of output signals, and an improvement in linearity (output linearity). These requirements are preferably achieved by, for example, decreasing the hysteresis of the GMR element of the magnetometric sensor. Specifically, the hysteresis of the GMR element can be decreased by, for example, applying a bias magnetic field to the free magnetic layer to align the magnetization direction of the free magnetic layer even when no induced magnetic field from a current to be measured is applied.

Japanese Unexamined Patent Application Publication No. 2012-185044 discloses an example of a method for applying a bias magnetic field to a free magnetic layer by stacking an antiferromagnetic layer on the free magnetic layer, where the antiferromagnetic layer causes an exchange coupling bias between it and the free magnetic layer to align the magnetization direction of the free magnetic layer in a prescribed direction in a state of permitting variation in magnetization.

The method for causing an exchange coupling bias by means of the antiferromagnetic layer has advantages, such as the uniformness of the bias magnetic field, compared to a method of causing a bias magnetic field by arranging permanent magnetics in the periphery of a GMR element. However, the GMR element stored under a high temperature environment for a long time has a risk of increasing the bias magnetic field due to the exchange coupling bias caused in the free magnetic layer and thereby decreasing the detection sensitivity of the GMR element.

These and other drawbacks exist.

SUMMARY OF THE DISCLOSURE

The present disclosure relates to formation of a single magnetic domain in a free magnetic layer based on the exchange coupling bias disclosed in Japanese Unexamined Patent Application Publication No. 2012-185044, and the present invention provides a magnetometric sensor comprising a giant magnetoresistance effect element (GMR element) hardly reducing the detection sensitivity, even in storage at a high temperature (specifically, for example, 150° C.) for a long time (specifically, for example, 1000 hr) and a current sensor employing the magnetometric sensor.

The present inventors have studied in order to solve the above-described problems and, as a result, have obtained new knowledge that a free magnetic layer including a specific layer can prevent a reduction in detection sensitivity of the magnetoresistance effect element even in storage under a high temperature environment for a long time.

According to various embodiments of the disclosure, a magnetometric sensor includes a magnetoresistance effect element having a sensitivity axis in a specific direction. The magnetoresistance effect element has a layered structure, including a fixed magnetic layer and a free magnetic layer stacked with a nonmagnetic material layer interposed therebetween, on a substrate and includes a first antiferromagnetic layer on the free magnetic layer on the opposite side to the side facing the nonmagnetic material layer to cause an exchange coupling bias between the first antiferromagnetic layer and the free magnetic layer and align the magnetization direction of the free magnetic layer in a prescribed direction in a state of permitting variation in magnetization. The free magnetic layer includes a misfit-reducing sub-layer for decreasing the lattice mismatch of the free magnetic layer with the first antiferromagnetic layer.

The free magnetic layer includes, in addition to the misfit-reducing sub-layer for decreasing the lattice mismatch of the free magnetic layer with the first antiferromagnetic layer, a first free magnetic sub-layer disposed between the misfit-reducing sub-layer and the nonmagnetic material layer and a second free magnetic sub-layer disposed between the misfit-reducing sub-layer and the first antiferromagnetic layer and ferromagnetically coupled to the first free magnetic sub-layer.

In various embodiments, the misfit-reducing sub-layer in the free magnetic layer decreases the lattice mismatch of the free magnetic layer with the first antiferromagnetic layer. As a result, the detection sensitivity of the magnetoresistance effect element is prevented from decreasing even in storage at a high temperature of about 150° C. for a long time of about 1000 hr.

The misfit-reducing sub-layer and the second free magnetic sub-layer each preferably have a face-centered cubic (fcc) structure, and the lattice spacing of the fcc(111) plane of the misfit-reducing sub-layer is preferably larger than that of the fcc(111) plane of the second free magnetic sub-layer.

The misfit-reducing sub-layer contains at least one selected from the group consisting of Pt, Pd, Ta, and W.

Additionally, according to various embodiments, a magnetometric sensor includes a magnetoresistance effect element having a sensitivity axis in a specific direction. The magnetoresistance effect element has a layered structure, comprising a fixed magnetic layer and a free magnetic layer stacked with a nonmagnetic material layer interposed therebetween, on a substrate and includes a first antiferromagnetic layer on the free magnetic layer on the opposite side to the side facing the nonmagnetic material layer to cause an exchange coupling bias between the first antiferromagnetic layer and the free magnetic layer and align the magnetization direction of the free magnetic layer in a prescribed direction in a state of permitting variation in magnetization. The free magnetic layer includes a first sub-layer serving as a misfit-reducing sub-layer for decreasing the lattice mismatch of the free magnetic layer with the first antiferromagnetic layer, a first free magnetic sub-layer disposed between the first sub-layer and the nonmagnetic material layer, and a second free magnetic sub-layer disposed between the first sub-layer and the first antiferromagnetic layer and ferromagnetically coupled to the first free magnetic sub-layer. The first sub-layer contains at least one selected from the group consisting of Pt, Pd, Ta, and W.

In such an embodiment, the first sub-layer in the free magnetic layer decreases the lattice mismatch of the free magnetic layer with the first antiferromagnetic layer. As a result, the detection sensitivity of the magnetoresistance effect element is prevented from decreasing even in storage at a high temperature of about 150° C. for a long time of about 1000 hr.

In various embodiments of the magnetometric sensor according to the above, wherein the free magnetic layer includes a misfit-reducing sub-layer being in contact with the first antiferromagnetic layer and decreasing the lattice mismatch of the free magnetic layer with the first antiferromagnetic layer, and a ferromagnetic sub-layer made of a ferromagnetic material disposed on the misfit-reducing sub-layer on the opposite side to the side facing the first antiferromagnetic layer.

In such embodiments, the misfit-reducing sub-layer, being in contact with the first antiferromagnetic layer, of the free magnetic layer reduces the lattice mismatch of the free magnetic layer with the first antiferromagnetic layer. As a result, the detection sensitivity of the magnetoresistance effect element is prevented from decreasing even in storage at a high temperature of about 150° C. for a long time of about 1000 hr.

The misfit-reducing sub-layer and the ferromagnetic sub-layer each preferably have a face-centered cubic (fcc) structure, and the lattice spacing of the fcc(111) plane of the misfit-reducing sub-layer is larger than that of the fcc(111) plane of the ferromagnetic sub-layer.

The misfit-reducing sub-layer contains at least one iron group element and at least one platinum group element.

In various embodiments, a magnetometric sensor includes a magnetoresistance effect element having a sensitivity axis in a specific direction. The magnetoresistance effect element has a layered structure, comprising a fixed magnetic layer and a free magnetic layer stacked with a nonmagnetic material layer interposed therebetween, on a substrate and includes a first antiferromagnetic layer on the free magnetic layer on the opposite side to the side facing the nonmagnetic material layer to cause an exchange coupling bias between the first antiferromagnetic layer and the free magnetic layer and align the magnetization direction of the free magnetic layer in a prescribed direction in a state of permitting variation in magnetization. The free magnetic layer includes a first sub-layer being in contact with the first antiferromagnetic layer and serving as a misfit-reducing sub-layer for decreasing the lattice mismatch of the free magnetic layer with the first antiferromagnetic layer, and a ferromagnetic sub-layer made of a ferromagnetic material disposed on the first sub-layer on the opposite side to the side facing the first antiferromagnetic layer. The first sub-layer contains at least one iron group element and at least one platinum group element.

In such an aspect, the free magnetic layer includes a first sub-layer being in contact with the first antiferromagnetic layer, and thereby the lattice mismatch of the free magnetic layer with the first antiferromagnetic layer is decreased. As a result, the detection sensitivity of the magnetoresistance effect element is prevented from decreasing even in storage at a high temperature of about 150° C. for a long time of about 1000 hr.

In various embodiments, the first antiferromagnetic layer of the magnetometric sensor contains a platinum group element and Mn.

In various embodiments, the first antiferromagnetic layer of the magnetometric sensor is formed of at least one of IrMn and PtMn.

The fixed magnetic layer of the magnetometric sensor may include a first magnetic sub-layer and a second magnetic sub-layer stacked with a nonmagnetic intermediate sub-layer interposed therebetween, the second magnetic sub-layer being in contact with the nonmagnetic material layer, wherein the first magnetic sub-layer and the second magnetic sub-layer may be self-pinned magnetic layers having magnetization fixed in mutually antiparallel directions.

The fixed magnetic layer of the magnetometric sensor may include a second antiferromagnetic sub-layer on the opposite side to the side facing the nonmagnetic material layer to cause an exchange coupling bias between the second antiferromagnetic sub-layer and the magnetic layer and align the magnetization direction of the fixed magnetic layer in a prescribed direction.

The layered structure of the magnetometric sensor may be a top pin structure having the free magnetic layer between the fixed magnetic layer and the substrate or may be a bottom pin structure having the fixed magnetic layer between the free magnetic layer and the substrate.

According to various embodiments, a current sensor includes the magnetometric sensor according to the present invention.

Also, a magnetometric sensor includes a magnetoresistance effect element hardly reducing the sensitivity, even in storage at a high temperature for a long time, although the mangnetometric sensor is of a system causing exchange coupling bias in the free magnetic layer. The various embodiments also provide a current sensor employing the magnetometric sensor.

DETAILED DESCRIPTION OF THE DISCLOSURE

The following description is intended to convey a thorough understanding of the embodiments described by providing a number of specific embodiments and details involving a magnetometric sensor and current sensor. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending on specific design and other needs.

Figure 1:
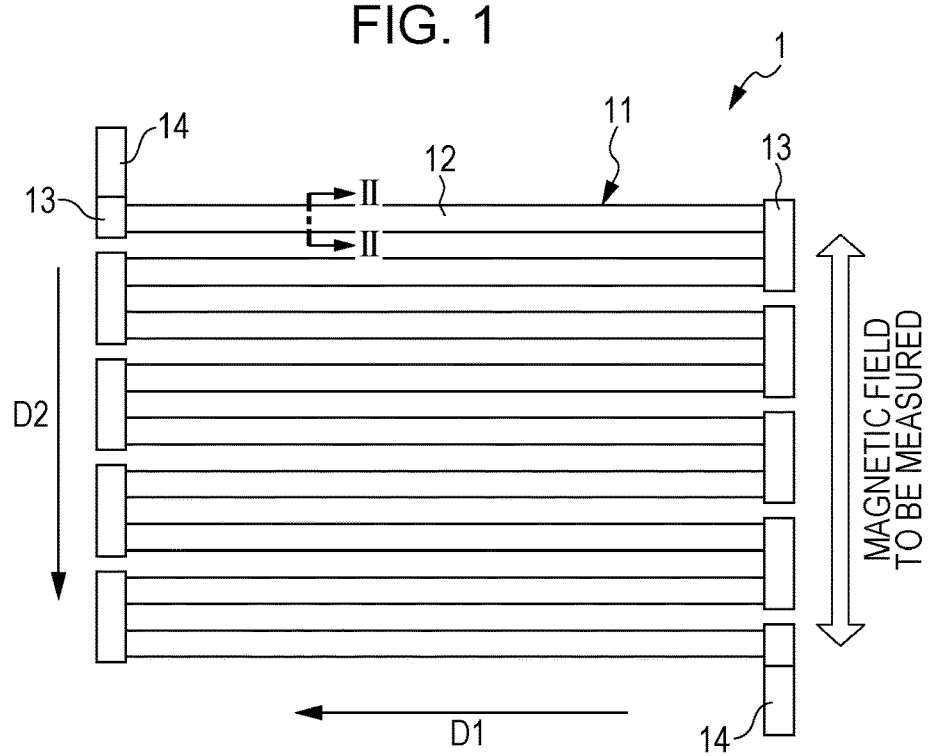
FIG. 1 is an enlarged plan view of a magnetoresistance effect element constituting a magnetometric sensor according to an embodiment of the present disclosure.
Figure 2:
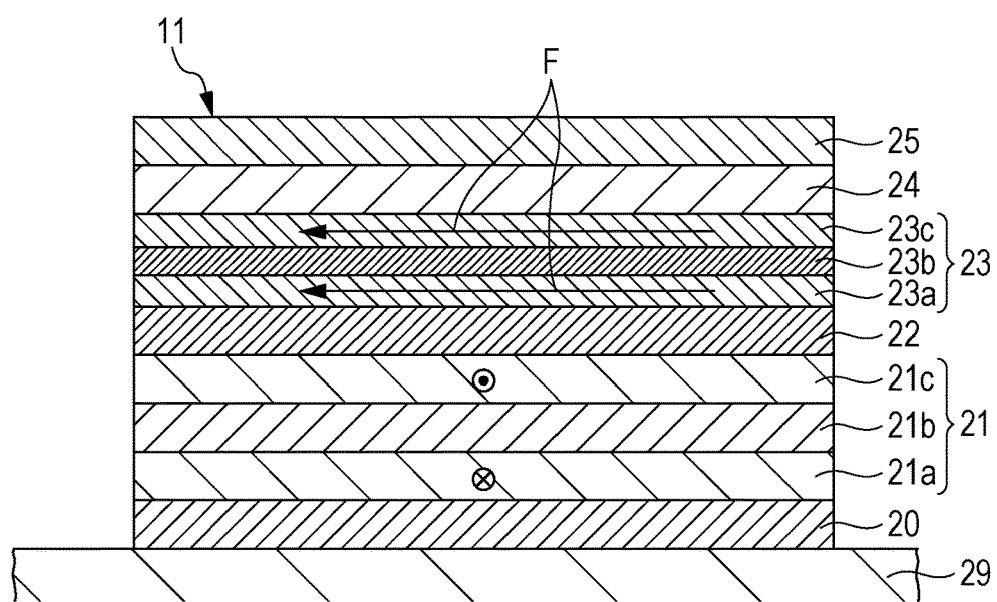
FIG. 2 is a cross-sectional view taken along the line II-II in FIG. 1.

FIG. 1 is a conceptual diagram (plan view) of a magnetometric sensor according to an example embodiment of the present disclosure. FIG. 2 is a cross-sectional view taken along the line II-II in FIG. 1.

The magnetometric sensor 1 according to an example embodiment of the present disclosure may include, as shown in FIG. 1, a magnetoresistance effect element 11 comprising GMR elements arranged in a stripe shape. The magnetoresistance effect element 11 may have a shape (meander shape) formed by a plurality of belt-like longitudinal patterns 12 (stripe) lying one above another such that the stripe longitudinal directions D1 (hereinafter, also simply referred to as "longitudinal directions D1") are in parallel to one another. In this magnetoresistance effect element 11 of a meander shape, the sensitivity-axis direction is a direction D2 (hereinafter, also simply referred to as "width direction D2") orthogonal to the longitudinal direction D1 of the longitudinal pattern 12. Accordingly, in the use of a magnetometric sensor 1 including the magnetoresistance effect element 11 of a meander shape, the magnetic field to be measured and the cancellation magnetic field are applied along the width direction D2.

The ends of the belt-like longitudinal patterns 12 arranged in parallel to one another are each connected to the adjacent belt-like longitudinal pattern 12 via a conductive part 13. The endmost longitudinal patterns 12 in the direction of the arrangement may be each connected to a connecting terminal 14 via a conductive part 13. The magnetoresistance effect element 11 thus may have a structure composed of a plurality of longitudinal patterns 12 connected in series via conductive parts 13 between two connecting terminals 14. The conductive parts 13 and the connecting terminals 14 may be nonmagnetic or magnetic and may be, for example, made of materials having low electrical resistance. The magnetometric sensor 1 can output signals from the magnetoresistance effect element 11 through the two connecting terminals 14. The signals from the magnetoresistance effect element 11 output through the connecting terminals 14 may be input into an operation part (not shown), and the operation part calculates the electricity to be measured based on the signals.

As shown in FIG. 2, the longitudinal patterns 12 of the magnetoresistance effect element 11 may be each composed of a seed layer 20, a fixed magnetic layer 21, a nonmagnetic material layer 22, a free magnetic layer 23, a first antiferromagnetic layer 24, and a protective layer 25 stacked in this order from the bottom to the top on a substrate 29 via, for example, an insulating layer (not shown). These layers may be formed by any method, such as sputtering.

The seed layer 20 may be formed of, for example, NiFeCr or Cr.

The fixed magnetic layer 21 may have a self-pinned structure composed of a first magnetic sub-layer 21a, a second magnetic sub-layer 21c, and a nonmagnetic intermediate sub-layer 21b disposed between the first magnetic sub-layer 21a and the second magnetic sub-layer 21c. As shown in FIG. 2, the fixed magnetization direction of the first magnetic sub-layer 21a and the fixed magnetization direction of the second magnetic sub-layer 21c are antiparallel. The fixed magnetization direction of the second magnetic sub-layer 21c is the fixed magnetization direction of the fixed magnetic layer 21, i.e., the sensitivity-axis direction.

As shown in FIG. 2, the first magnetic sub-layer 21a may be disposed on the seed layer 20. The second magnetic sub-layer 21c may be disposed so as to be in contact with a nonmagnetic material layer 22 which will be described below. The first magnetic sub-layer 21a may be made of, for example, a CoFe alloy having a coercive force higher than that of the second magnetic sub-layer 21c.

The second magnetic sub-layer 21c being in contact with the nonmagnetic material layer 22 contributes to the magnetoresistance effect (specifically, a GMR effect) and is made of a magnetic material capable of increasing the mean free path difference between the up-spin and down-spin conduction electrons.

In the magnetoresistance effect element 11 shown in FIG. 2, the magnetization amounts (saturated magnetization Ms×layer thickness t) of the first magnetic sub-layer 21a and the second magnetic sub-layer 21c may be adjusted to be substantially equal to each other.

The fixed magnetic layer 21 of the magnetoresistance effect element 11 shown in FIG. 2 may be of a self-pinned structure and therefore does not include any antiferromagnetic layer. Consequently, the temperature characteristics of the magnetoresistance effect element 11 are not restricted by the blocking temperature of an antiferromagnetic layer.

In order to enhance the magnetization fixing power of the fixed magnetic layer 21, it is important to increase the coercive force Hc of the first magnetic sub-layer 21a, to adjust the magnetization amounts of the first magnetic sub-layer 21a and the second magnetic sub-layer 21c to be substantially equal to each other, and to enhance the antiparallel coupling magnetic field due to RKKY interaction caused between the first magnetic sub-layer 21a and the second magnetic sub-layer 21c by controlling the thickness of the nonmagnetic intermediate sub-layer 21b. Such appropriate adjustment further rigidly fixes the magnetization, while the fixed magnetic layer 21 from being affected by outside magnetic fields.

The nonmagnetic material layer 22 may be made of, for example, copper (Cu).

The free magnetic layer 23 of the magnetoresistance effect element 11 shown in FIG. 2 may be composed of a first free magnetic sub-layer 23a, a misfit-reducing sub-layer 23b, and a second free magnetic sub-layer 23c. The first free magnetic sub-layer 23a and the second free magnetic sub-layer 23c each may have a monolayer structure or a layered structure of a ferromagnetic material, such as, for example, NiFe or CoFe, and are ferromagnetically coupled to each other with the misfit-reducing sub-layer 23b therebetween. That is, as shown in FIG. 2, the first free magnetic sub-layer 23a and the second free magnetic sub-layer 23c are magnetized in parallel in the same direction.

The misfit-reducing sub-layer 23b reduces the lattice mismatch of the free magnetic layer 23 with the first antiferromagnetic layer 24. This point will be described using an example in which the material constituting the free magnetic layer contains NiFe and the material constituting the first antiferromagnetic layer is IrMn. The X-ray diffraction spectrum of a layered product consisting of the free magnetic layer containing NiFe and the first antiferromagnetic layer made of IrMn has a peak based on the fcc(111) plane of the free magnetic layer at approximately 51.5° and a peak based on the fcc(111) plane of the first antiferromagnetic layer at approximately 48.5°. The lattice spacings calculated based on these measurement results are 2.18 Å in the IrMn constituting the first antiferromagnetic layer and 2.06 Å in the NiFe constituting the free magnetic layer. The lattice mismatch is estimated to be about 6%.

In contrast, when the free magnetic layer 23 includes a misfit-reducing sub-layer 23b as in the magnetoresistance effect element 11 according to the first embodiment of the present invention, in the X-ray diffraction spectrum of a layered product consisting of the free magnetic layer 23 and the first antiferromagnetic layer 24 made of IrMn, the peak based on the free magnetic layer 23 shifts to the lower-angle side to reduce the lattice mismatch between the free magnetic layer 23 and the first antiferromagnetic layer 24. The lattice mismatch between the free magnetic layer 23 and the first antiferromagnetic layer 24 may be reduced by that since the lattice spacing of the misfit-reducing sub-layer 23b is larger than the lattice spacing of the second free magnetic sub-layer 23c, the lattice spacing of the second free magnetic sub-layer 23c is increased to approach the lattice spacing of the first antiferromagnetic layer 24. Incidentally, the lattice spacing of the fcc(111) plane of Pt is 2.26 Å. Thus, the lattice spacing of the fcc(111) plane of the misfit-reducing sub-layer 23b may be larger than the lattice spacing of the fcc(111) plane of the free magnetic layer 23, in particular, of the second free magnetic sub-layer 23c.

Such a reduction in the lattice mismatch between the free magnetic layer 23 and the first antiferromagnetic layer 24 prevents the decrease in the detection sensitivity, due to storage under a high temperature environment for a long time, of the magnetometric sensor 1 comprising the magnetoresistance effect element 11 according to the first embodiment of the present invention, compared to a case of having large lattice mismatch.

The detection sensitivity of the magnetometric sensor 1 stored under a high temperature environment for a long time may be prevented from decreasing by a reduction in the lattice mismatch between the free magnetic layer 23 and the first antiferromagnetic layer 24 probably by that an increase in the lattice matching property of the free magnetic layer 23 with the first antiferromagnetic layer 24 hinders the atoms contained in the first antiferromagnetic layer 24 from moving, resulting in a decrease in the variation of the exchange coupling magnetic field due to storage under a high temperature environment for a long time.

The misfit-reducing sub-layer 23b may have any composition that can contribute to a reduction in the lattice mismatch between the free magnetic layer 23 and the first antiferromagnetic layer 24 and may be constituted of a material having an atomic radius larger than that of the material constituting the free magnetic layer, for example. The misfit-reducing sub-layer 23b may have a monolayer structure or a layered structure. When the first free magnetic sub-layer 23a and the second free magnetic sub-layer 23c are made of NiFe or CoFe and the first antiferromagnetic layer 24 is made of IrMn or PtMn, the misfit-reducing sub-layer 23b may be a first sub-layer containing at least one selected from the group consisting of Pt, Pd, Ta, and W. From the viewpoint of stably causing ferromagnetic coupling between the first free magnetic sub-layer 23a and the second free magnetic sub-layer 23c, the misfit-reducing sub-layer 23b preferably contains at least one of Pt and Pd, and at least one selected from the group consisting of Pt, Pd, and PtPd. If the first free magnetic sub-layer 23a and the second free magnetic sub-layer 23c are not ferromagnetically coupled, an exchange coupling bias is hardly caused in the free magnetic layer 23. In further consideration of productivity and other factors, the misfit-reducing sub-layer 23b may be made of Pt or Pd, for example.

The misfit-reducing sub-layer 23b may have any thickness that can contribute to a reduction in the lattice mismatch between the free magnetic layer 23 and the first antiferromagnetic layer 24. An excessively thin misfit-reducing sub-layer 23b cannot reduce the lattice mismatch between the free magnetic layer 23 and the first antiferromagnetic layer 24, whereas an excessively thick misfit-reducing sub-layer 23b cannot maintain the ferromagnetic coupling between the first free magnetic sub-layer 23a and second free magnetic sub-layer 23c. In consideration of these characteristics, the thickness of the misfit-reducing sub-layer 23b may be appropriately determined. When the first free magnetic sub-layer 23a and the second free magnetic sub-layer 23c are made of NiFe or CoFe, the first antiferromagnetic layer 24 is made of IrMn or PtMn, and the misfit-reducing sub-layer 23b is made of Pt, the misfit-reducing sub-layer 23b may have a thickness of 3 Å or more and 15 Å or less.

The protective layer 25 may be made of any material. An example of the material is tantalum (Ta). The magnetization direction F, shown in FIG. 2, of the free magnetic layer 23 of the magnetoresistance effect element 11 is the initial magnetization direction. The magnetization direction F of the free magnetic layer 23 is aligned to be orthogonal to the fixed magnetization direction of the fixed magnetic layer 21 (the fixed magnetization direction of the second magnetic sub-layer 21c).

In the magnetoresistance effect element 11 shown in FIG. 2, although the first antiferromagnetic layer 24 is formed on the whole upper surface of the free magnetic layer 23, the first antiferromagnetic layer 24 is not limited thereto and may be discontinuously formed on the upper surface of the free magnetic layer 23. However, a first antiferromagnetic layer 24 formed on the whole surface of the free magnetic layer 23 can appropriately make the whole free magnetic layer 23 into a single magnetic domain in one direction and can further reduce the hysteresis, leading to an improvement in the measurement accuracy.

In the magnetoresistance effect element 11 shown in FIG. 2, the fixed magnetic layer 21 has a self-pinned structure, but is not limited thereto. For example, as in the magnetoresistance effect element 11' shown in FIG. 3, the fixed magnetic layer 21 may have a layered structure composed of a second antiferromagnetic sub-layer 21d and a ferromagnetic sub-layer 21e such that the fixed magnetic layer 21 is magnetized through the magnetization of the ferromagnetic sub-layer 21e in a specific direction (in FIG. 3, in the direction toward the rear side of the paper in the direction normal to the plane of the paper) by exchange coupling of the ferromagnetic sub-layer 21e with the second antiferromagnetic sub-layer 21d.

According to various embodiments, the example magnetometric sensor may be produced by any process For example, a seed layer 20 may be formed on a substrate 29 provided with an insulating layer (not shown in FIG. 2), and a fixed magnetic layer 21 having a self-pinned structure is stacked on the seed layer 20. Specifically, as shown in FIG. 2, a first magnetic sub-layer 21a, a nonmagnetic intermediate sub-layer 21b, and a second magnetic sub-layer 21c may be sequentially stacked. These layers may be formed by sputtering, but may be formed by any method. When the first magnetic sub-layer 21a is formed under application of a magnetic field such that the first magnetic sub-layer 21a is magnetized along the width direction D2 in FIG. 1, the second magnetic sub-layer 21c can be strongly magnetized in the direction antiparallel to the magnetization direction of the first magnetic sub-layer 21a by means of RKKY interaction. The thus-magnetized second magnetic sub-layer 21c can maintain the state of being magnetized in the width direction D2 even if a magnetic field in a direction different from the magnetization direction of the second magnetic sub-layer 21c itself is applied during the subsequent production procedure.

Subsequently, a nonmagnetic material layer 22 may be stacked on the fixed magnetic layer 21. The nonmagnetic material layer 22 may be formed by sputtering, but may be formed by any method.

Subsequently, a free magnetic layer 23, a first antiferromagnetic layer 24, and a protective layer 25 may be sequentially stacked on the nonmagnetic material layer 22 under application of a magnetic field along the longitudinal direction D1. These layers may be formed by sputtering, but may be formed by any method. By forming the layers in a magnetic field, an exchange coupling bias is caused between the free magnetic layer 23 and the first antiferromagnetic layer 24 along the magnetization direction of the free magnetic layer 23. During the formation of these layers, although the magnetic field is also applied to the fixed magnetic layer 21, the magnetization direction of the fixed magnetic layer 21 is not varied by this applied magnetic field, since the fixed magnetic layer 21 has a pinned structure formed by the RKKY interaction.

When the first antiferromagnetic layer 24 is made of an IrMn-based material, the magnetization direction of the first antiferromagnetic layer 24 can be aligned by film formation in a magnetic field not accompanied by particular heat treatment. Accordingly, it is possible not to perform annealing in a magnetic field throughout the whole process of producing the magnetoresistance effect element 11. As described above, the annealing-free process in a magnetic field can easily produce magnetoresistance effect elements 11 having different sensitivity axes (including the cases of magnetization in opposite directions) on a single substrate 29. In a process of producing a magnetoresistance effect element 11 including a step of annealing in a magnetic field, if the annealing in a magnetic field is repeated multiple times, the effect of annealing in a magnetic field may be weakened by the subsequent annealing in a magnetic field, leading to a difficulty in appropriate alignment of the magnetization direction.

After the formation of the free magnetic layer 23 and the first antiferromagnetic layer 24 in a magnetic field, a protective layer 25 is finally stacked. The protective layer 25 may be formed by sputtering, but may be formed by any method.

The layered structure prepared by the process described above may be subjected to removal processing (milling) and may be formed into a plurality of longitudinal patterns 12 arranged along the width direction D2. Conductive parts 13 connecting the longitudinal patterns 12 may be formed, and connecting terminals 14 may be connected to the respective conductive parts 13 to give a magnetoresistance effect element 11 having a meander shape shown in FIG. 1.

3. Current Sensor

The magnetometric sensor comprising the magnetoresistance effect element according to various embodiments can be suitably used as a current sensor. Such a current sensor may include four magnetoresistance effect elements forming a bridge circuit to enhance the measurement accuracy as described in, for example, Japanese Unexamined Patent Application Publication No. 2012-185044, although the current sensor may include a single magnetoresistance effect element. An example of the method of producing a magnetoresistance effect element according to various embodiments does not include a step of annealing in a magnetic field and therefore can easily produce a plurality of magnetoresistance effect elements on a single substrate.

Examples of the current sensor according to various embodiments include a magnetic proportional current sensor and a magnetic balance current sensor.

The magnetic proportional current sensor includes at least one magnetoresistance effect element according to the above described embodiments (a magnetoresistance effect element having a layered structure composed of a fixed magnetic layer and a free magnetic layer stacked with a nonmagnetic material layer interposed therebetween and including a first antiferromagnetic layer on the free magnetic layer on the opposite side to the side facing the nonmagnetic material layer to cause an exchange coupling bias between the first antiferromagnetic layer and the free magnetic layer and align the magnetization direction of the free magnetic layer in a prescribed direction in a state of permitting variation in magnetization, wherein the free magnetic layer includes a misfit-reducing sub-layer for decreasing the lattice mismatch of the free magnetic layer with the first antiferromagnetic layer, a first free magnetic sub-layer disposed between the misfit-reducing sub-layer and the nonmagnetic material layer, and a second free magnetic sub-layer disposed between the misfit-reducing sub-layer and the first antiferromagnetic layer and ferromagnetically coupled to the first free magnetic sub-layer; or a magnetoresistance effect element having a layered structure composed of a fixed magnetic layer and a free magnetic layer stacked with a nonmagnetic material layer interposed therebetween and including a first antiferromagnetic layer on the free magnetic layer on the opposite side to the side facing the nonmagnetic material layer to cause an exchange coupling bias between the first antiferromagnetic layer and the free magnetic layer and align the magnetization direction of the free magnetic layer in a prescribed direction in a state of permitting variation in magnetization, wherein the free magnetic layer includes a first sub-layer containing at least one selected from the group consisting of Pt, Pd, Ta, and W, a first free magnetic sub-layer disposed between the first sub-layer and the nonmagnetic material layer, and a second free magnetic sub-layer disposed between the first sub-layer and the first antiferromagnetic layer and ferromagnetically coupled to the first free magnetic sub-layer), and the magnetic proportional current sensor includes a magnetic field detecting bridge circuit having two outputs for generating a potential difference according to the induced magnetic field from a current to be measured. The magnetic proportional current sensor measures a current based on the difference in the potentials output from the magnetic field detecting bridge circuit according to the induced magnetic field.

The magnetic balance current sensor includes at least one magnetoresistance effect element according to the above described embodiments and includes a magnetic field detecting bridge circuit having two outputs for generating a potential difference according to the induced magnetic field from a current to be measured and a feedback coil disposed near the magnetoresistance effect element and generating a cancellation magnetic field that cancels out the induced magnetic field. In the magnetic balance current sensor, the feedback coil is energized with the potential difference, and the current to be measured is measured based on the current flowing in the feedback coil when the induced magnetic field and the cancellation magnetic field cancel each other out into an equilibrium state.

Figure 3:
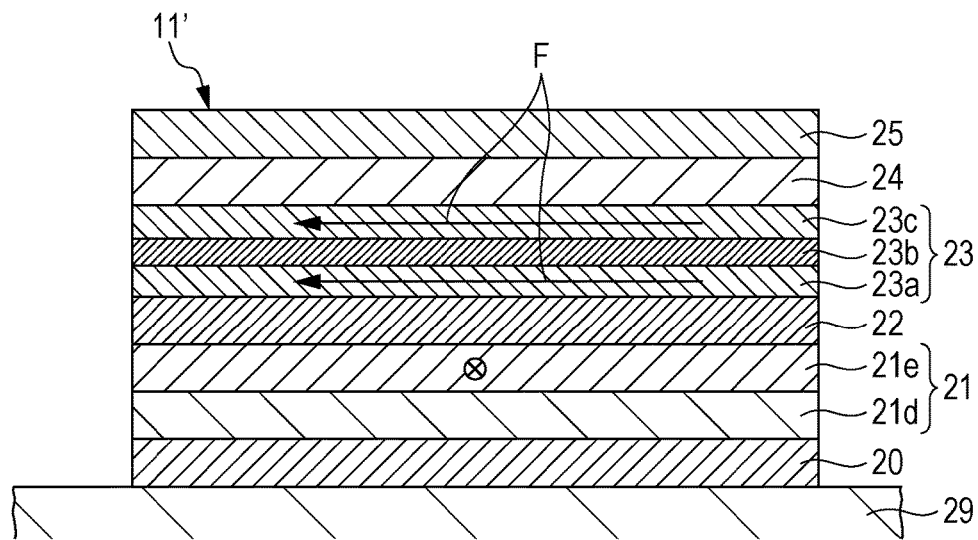
FIG. 3 is a cross-sectional view taken along the line II-II in FIG. 1 when the magnetoresistance effect element constituting a magnetometric sensor shown in FIG. 1 includes a fixed magnetic layer of an exchange coupling type instead of a self-pinned type.

Referring now to FIGS. 2 and 3, for example, although FIGS. 2 and 3 show magnetoresistance effect elements 11 and 11' that are each of a bottom pin structure having the fixed magnetic layer 21 between the free magnetic layer 23 and the substrate 29, the magnetoresistance effect element of the present disclosure may be of a top pin structure having a free magnetic layer between a fixed magnetic layer and a substrate.

A seed layer of NiFeCr (42), a fixed magnetic layer of [first magnetic sub-layer of $Co_{40}Fe_{60}$ (19)/nonmagnetic intermediate sub-layer of Ru (3.6)/second magnetic sub-layer of $Co_{90}Fe_{10}$ (24)], a nonmagnetic material layer of Cu (22), a free magnetic layer of [$Co_{90}Fe_{10}$ (10)/$Ni_{82.5}Fe_{17.5}$ (70)], an antiferromagnetic layer of $Ir_{22}Mn_{78}$ (80), and a protective layer of Ta (100) were sequentially stacked in this order from the bottom to the top on a substrate provided with an insulating layer to form a first comparative layered structure. The figures in parentheses each denote the layer thickness, and their unit is Å.

(X-Ray Diffraction Measurement)

Figure 4:
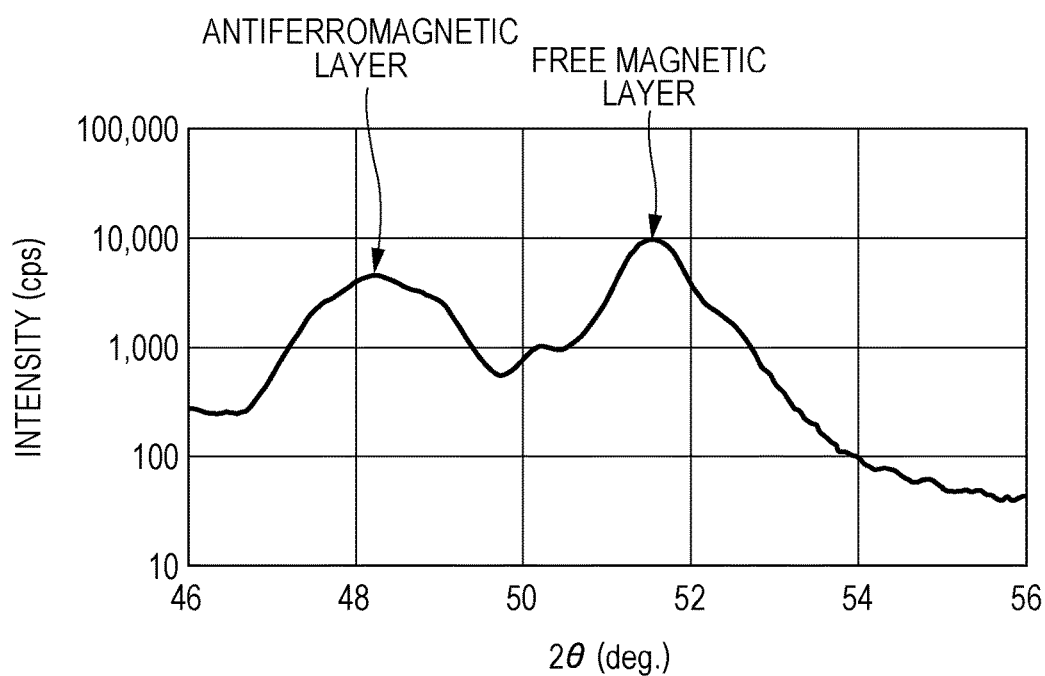
FIG. 4 is an X-ray diffraction spectrum (2θ: 46° to 56°) of a first comparative layered structure.

The X-ray diffraction of the first comparative layered structure was measured. The X-ray source used was CoKα ray ($\lambda$=1.789 Å). The results (2θ: 46° to 56°) are shown in FIG. 4. As shown in FIG. 4, a peak was observed near 48.5°. This peak was based on the fcc(111) plane of the antiferromagnetic layer, and the lattice spacing calculated was 2.18 Å. A peak was also observed near 51.5°. This peak was based on the fcc(111) plane of the free magnetic layer, and the lattice spacing calculated was 2.06 Å. The lattice mismatch based on these calculated lattice spacings was 6%.

Example 1-1

A seed layer 20 of NiFeCr (42), a fixed magnetic layer 21 of [first magnetic sub-layer 21a of $Co_{40}Fe_{60}$ (19)/nonmagnetic intermediate sub-layer 21b of Ru (3.6)/second magnetic sub-layer 21c of $Co_{90}Fe_{10}$ (24)], a nonmagnetic material layer 22 of Cu (22), a free magnetic layer 23 of [first free magnetic sub-layer 23a of ($Co_{90}Fe_{10}$ (10)/$Ni_{82.5}Fe_{17.5}$ (40))/misfit-reducing sub-layer 23b of Pt (3)/second free magnetic sub-layer 23c of $Ni_{82.5}Fe_{17.5}$ (30)], a first antiferromagnetic layer 24 of $Ir_{22}Mn_{78}$ (80), and a protective layer 25 of Ta (100) were sequentially stacked in this order from the bottom to the top on a substrate 29 provided with an insulating layer to form a first layered structure. The figures in parentheses each denote the layer thickness, and their unit is Å. The misfit-reducing sub-layer 23b of the first layered structure was also defined as a layer containing at least one selected from the group consisting of Pt, Pd, Ta, and W and was therefore also regarded as a first sub-layer.

Example 1-2

A second layered structure was formed as in Example 1-1 except that the misfit-reducing sub-layer 23b was a layer (thickness: 3 Å) of Ta, instead of Pt. The misfit-reducing sub-layer 23b of the second layered structure was also defined as a layer containing at least one selected from the group consisting of Pt, Pd, Ta, and W and was therefore also regarded as a first sub-layer.

(X-Ray Diffraction Measurement)

Figure 5:
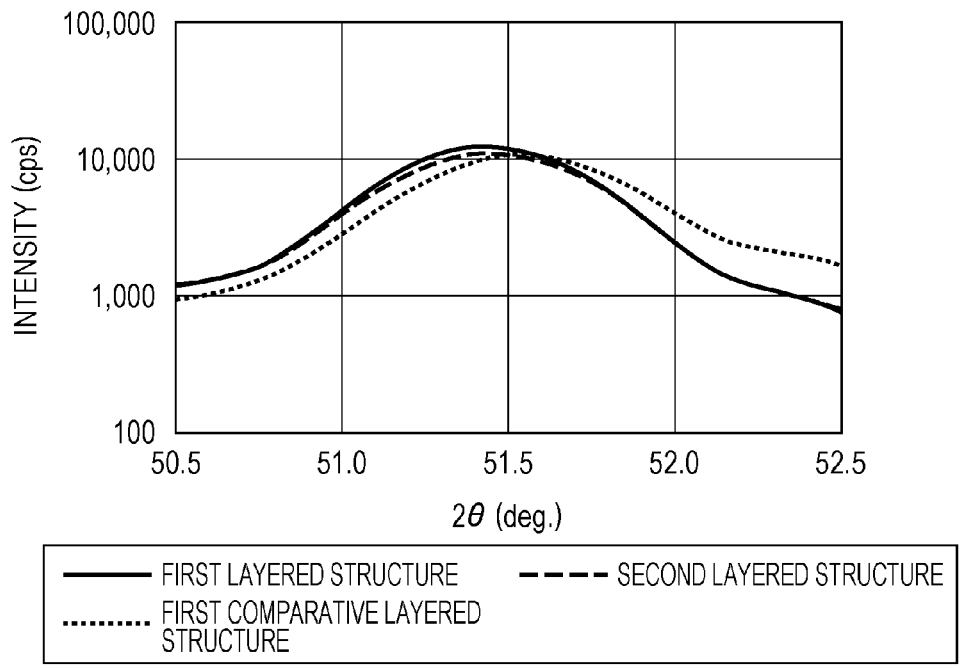
FIG. 5 is X-ray diffraction spectra (2θ: 50.5° to 52.5°) of a first comparative layered structure, a first layered structure, and a second layered structure.

The X-ray diffractions of the first comparative layered structure, the first layered structure, and the second layered structure were measured. The X-ray source used was CoKα ray ($\lambda$=1.789 Å). The results (2θ: 50.5° to 52.5°) are shown in FIG. 5. As shown in FIG. 5, the peaks based on the free magnetic layers of the first layered structure and the second layered structure shifted to the lower-angle side than the peak based on the free magnetic layer of the first comparative layered structure to demonstrate that the lattice mismatch between the free magnetic layer 23 and the first antiferromagnetic layer 24 is reduced by introduction of the misfit-reducing sub-layer 23b.

Figure 6:
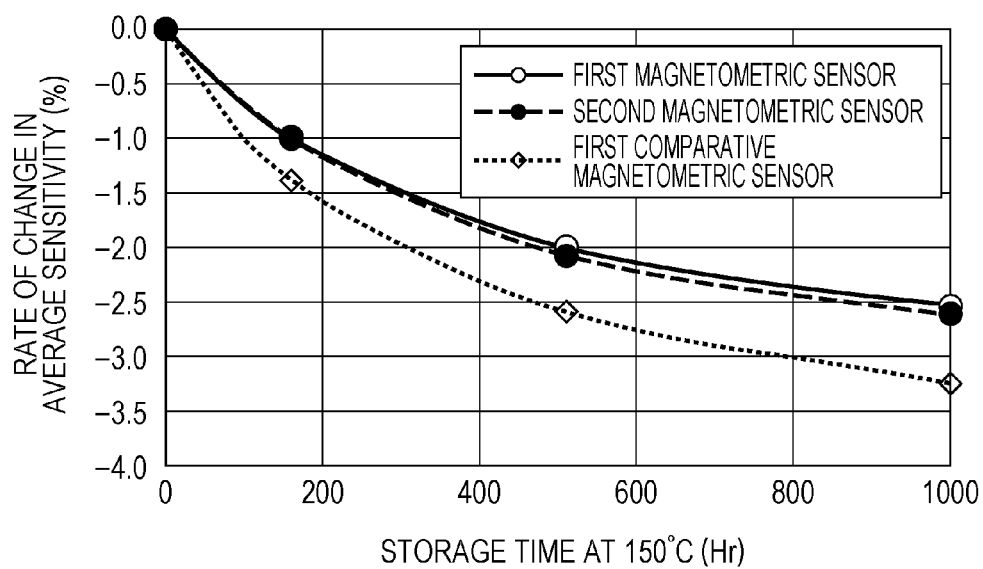
FIG. 6 is a graph showing the changes in average sensitivity of a first comparative magnetometric sensor, a first magnetometric sensor, and a second magnetometric sensor caused by the storage under an environment of 150° C. for a predetermined time.

Magnetometric sensors comprising the first comparative layered structure, the first layered structure, or the second layered structure (respectively referred to as "first comparative magnetometric sensor", "first magnetometric sensor", and "second magnetometric sensor") were produced. The magnetometric sensors were each stored under an environment of 150° C. for a predetermined time, and the changes in average sensitivity caused by the storage were measured. The measurement results are shown in FIG. 6. As shown in FIG. 6, the changes in average sensitivity of the first magnetometric sensor and the second magnetometric sensor stored under a high temperature environment for a long time were smaller than that of the first comparative magnetometric sensor.

In a further example, a seed layer 20 of NiFeCr (42), a fixed magnetic layer 21 of [first magnetic sub-layer 21a of $Co_{40}Fe_{60}$ (19)/nonmagnetic intermediate sub-layer 21b of Ru (3.6)/second magnetic sub-layer 21c of $Co_{90}Fe_{10}$ (24)], a nonmagnetic material layer 22 of Cu (22), a free magnetic layer 23 of [first free magnetic sub-layer 23a of ($Co_{90}Fe_{10}$ (10)/$Ni_{81.5}Fe_{18.5}$(40))/misfit-reducing sub-layer 23b of Pt (Example 2-1) or Ta (Example 2-2)/second free magnetic sub-layer 23c of $Ni_{81.5}Fe_{18.5}$ (30)], a first antiferromagnetic layer 24 of $Ir_{22}Mn_{78}$ (80), and a protective layer 25 of Ta (100) were sequentially stacked in this order from the bottom to the top on a substrate 29 provided with an insulating layer to form a third layered structure (Example 2-1) or a fourth layered structure (Example 2-2). The figures in parentheses each denote the layer thickness, and their unit is A. The misfit-reducing sub-layer 23b of the third or fourth layered structure was also defined as a layer containing at least one selected from the group consisting of Pt, Pd, Ta, and W and was therefore also regarded as a first sub-layer.

Figure 7:
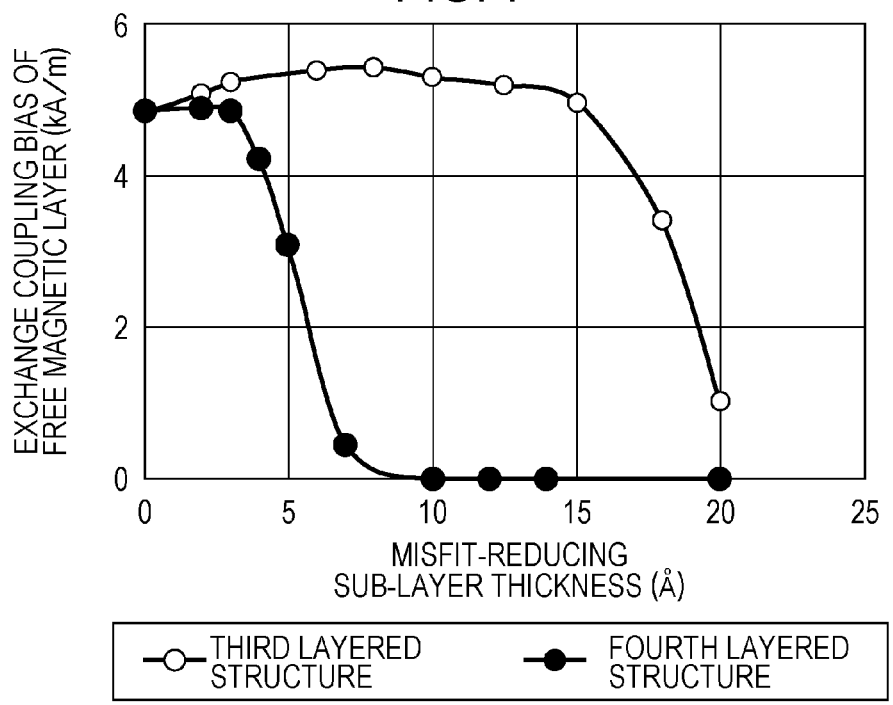
FIG. 7 is a graph showing the exchange coupling bias (unit: kA/m) caused in each free magnetic layer of third and fourth layered structures, the misfit-reducing sub-layer of which having a thickness ranging from 0 Å to 20 Å.

The exchange coupling bias (unit: kA/m) caused in each free magnetic layer 23 of the third and fourth layered structures was measured by changing the thickness of the misfit-reducing sub-layer 23b in a range of 0 Å to 20 Å. The measurement results are shown in FIG. 7. As shown in FIG. 7, an excessively large thickness of the misfit-reducing sub-layer 23b decreased the exchange coupling bias. In the third layered structure comprising a Pt layer as the misfit-reducing sub-layer 23b, this phenomenon was obvious when the thickness of the misfit-reducing sub-layer 23b was 18 Å or more. In the fourth layered structure comprising a Ta layer as the misfit-reducing sub-layer 23b, this phenomenon was obvious when the thickness of the misfit-reducing sub-layer 23b was 5 Å or more.

In a further example, a seed layer 20 of NiFeCr (42), a fixed magnetic layer 21 of [first magnetic sub-layer 21a of $Co_{40}Fe_{60}$ (19)/nonmagnetic intermediate sub-layer 21b of Ru (3.6)/second magnetic sub-layer 21c of $Co_{90}Fe_{10}$ (24)], a nonmagnetic material layer 22 of Cu (22), a free magnetic layer 23 of [first free magnetic sub-layer 23a of ($Co_{90}Fe_{10}$ (10)/$Ni_{81.5}Fe_{18.5}$ (70−X))/misfit-reducing sub-layer 23b of Pt (5)/second free magnetic sub-layer 23c of $Ni_{81.5}Fe_{18.5}$ (X)], a first antiferromagnetic layer 24 of $Ir_{22}Mn_{78}$ (80), and a protective layer 25 of Ta (100) were sequentially stacked in this order from the bottom to the top on a substrate 29 provided with an insulating layer to form a fifth layered structure. The figures in parentheses each denote the layer thickness, and their unit is Å. The misfit-reducing sub-layer 23b of the fifth layered structure was also defined as a layer containing at least one selected from the group consisting of Pt, Pd, Ta, and W and was therefore also regarded as a first sub-layer.

The exchange coupling bias (unit: kA/m) caused in the free magnetic layer 23 of the fifth layered structure was measured changing the thickness X (unit: Å) of the second free magnetic sub-layer 23c in a range of 0 Å to 70 Å, while adjusting the total thickness of the first free magnetic sub-layer and the second free magnetic sub-layer to 70 Å, and the rate of decrease in the average sensitivity (the absolute value the rate of change in the average sensitivity) of the magnetometric sensor comprising the fifth layered structure was measured after the storage under an environment of 150° C. for 1000 hr. The results are shown in FIG. 8.

Figure 8:
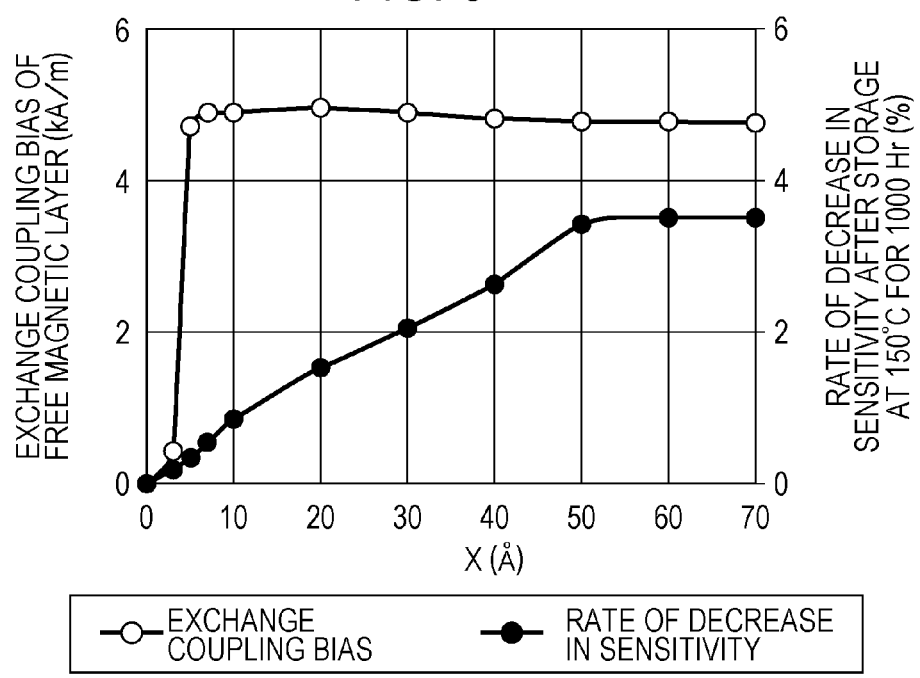
FIG. 8 is a graph showing the exchange coupling bias (unit: kA/m) caused in each free magnetic layer of fifth layered structures, the second free magnetic sub-layer of which having a thickness X (unit: Å) ranging from 0 Å to 70 Å, while adjusting each total thickness of the first free magnetic sub-layer and the second free magnetic sub-layer to 70 Å, and the rate of decrease in the average sensitivity of the magnetometric sensor comprising the fifth layered structure stored under an environment of 150° C. for 1000 hr.

As shown in FIG. 8, the dependency on the thickness X of the second free magnetic sub-layer (unit: Å) of the magnitude of the exchange coupling bias was different from that of the rate of decrease in the average sensitivity. The magnitude of the exchange coupling bias sharply increased before the thickness X of the second free magnetic sub-layer reached 5 (Å) and was then constant after the thickness X reached 5 (Å) without being affected by the thickness X of the second free magnetic sub-layer. In contrast, the rate of decrease in the average sensitivity monotonously reduced with a decrease in the thickness X of the second free magnetic sub-layer within a thickness range of less than 50 (Å). This suggests that a second free magnetic sub-layer having a smaller thickness X more remarkably exhibits the effect of the misfit-reducing sub-layer.

Figure 9:
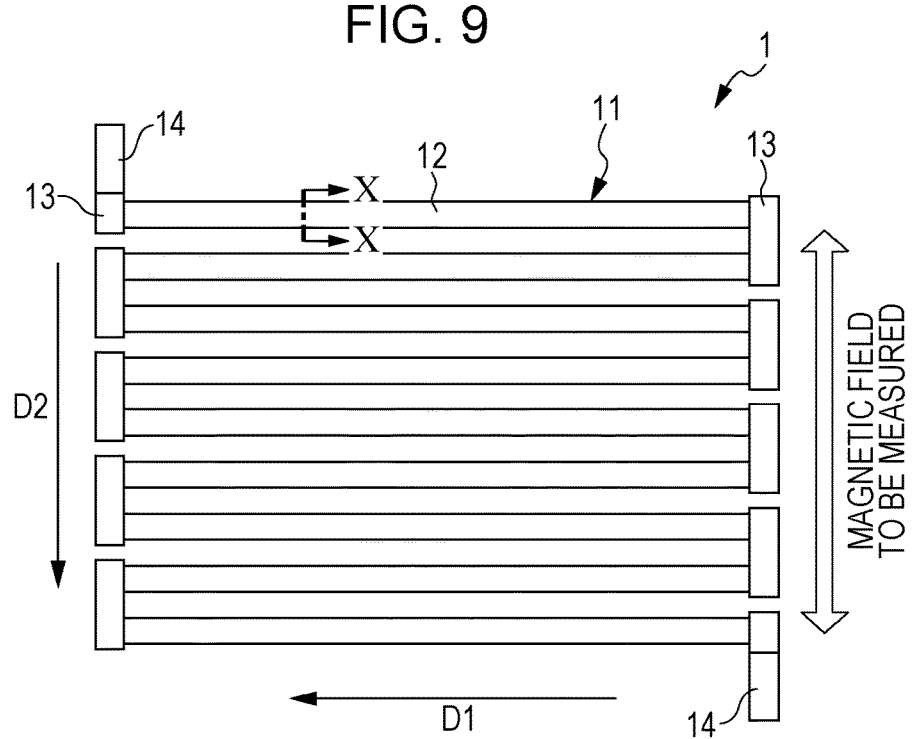
FIG. 9 is an enlarged plan view of a magnetoresistance effect element constituting a magnetometric sensor according to an embodiment of the present disclosure.
Figure 10:
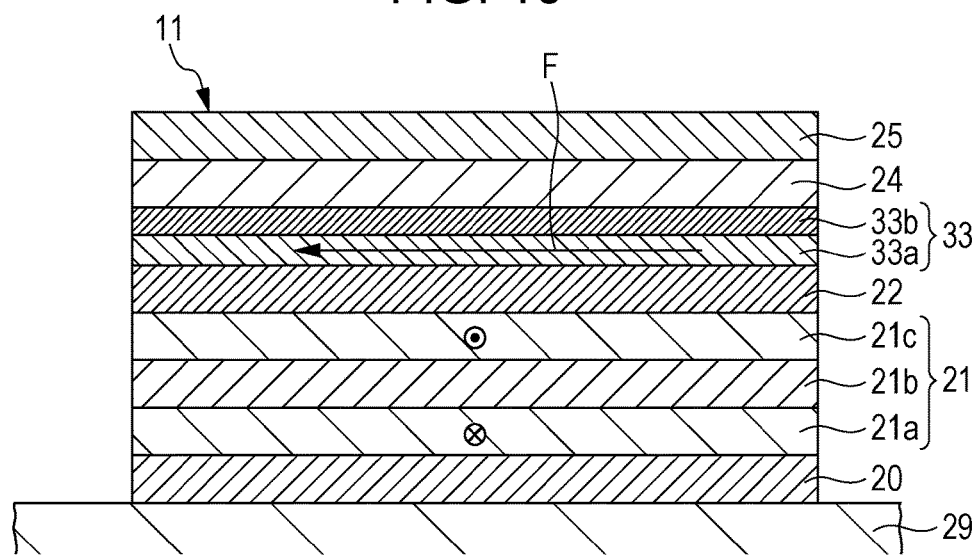
FIG. 10 is a cross-sectional view taken along the line X-X in FIG. 9.

Referring now to FIGS. 9 and 10, FIG. 9 is a conceptual diagram (plan view) of a magnetometric sensor according to a second embodiment of the present invention. FIG. 10 is a cross-sectional view taken along the line X-X in FIG. 9.

The magnetometric sensor 1 according to an example embodiment of the present disclosure may include, as shown in FIG. 9, a magnetoresistance effect element 11 comprising GMR elements arranged in a stripe shape. The magnetoresistance effect element 11 may have a shape (meander shape) formed by a plurality of belt-like longitudinal patterns 12 (stripe) lying one above another such that the stripe longitudinal directions D1 (hereinafter, also simply referred to as "longitudinal directions D1") are in parallel to one another. In this magnetoresistance effect element 11 of a meander shape, the sensitivity-axis direction is a direction D2 (hereinafter, also simply referred to as "width direction D2") orthogonal to the longitudinal direction D1 of the longitudinal pattern 12. Accordingly, in the use of a magnetometric sensor 1 including the magnetoresistance effect element 11 of a meander shape, the magnetic field to be measured and the cancellation magnetic field are applied along the width direction D2.

The ends of the belt-like longitudinal patterns 12 arranged in parallel to one another are each connected to the adjacent belt-like longitudinal pattern 12 via a conductive part 13. The endmost longitudinal patterns 12 in the direction of the arrangement are each connected to a connecting terminal 14 via a conductive part 13. The magnetoresistance effect element 11 thus may have a structure composed of a plurality of longitudinal patterns 12 connected in series via conductive parts 13 between two connecting terminals 14. The conductive parts 13 and the connecting terminals 14 may be nonmagnetic or magnetic and are preferably made of materials having low electrical resistance. The magnetometric sensor 1 can output signals from the magnetoresistance effect element 11 through the two connecting terminals 14. The signals from the magnetoresistance effect element 11 output through the connecting terminals 14 are input into an operation part (not shown), and the operation part calculates the electricity to be measured based on the signals.

As shown in FIG. 10, the longitudinal patterns 12 of the magnetoresistance effect element 11 may be each composed of a seed layer 20, a fixed magnetic layer 21, a nonmagnetic material layer 22, a free magnetic layer 33, a first antiferromagnetic layer 24, and a protective layer 25 stacked in this order from the bottom to the top on a substrate 29 via, for example, an insulating layer (not shown). These layers may be formed by any method, such as sputtering.

The seed layer 20 may be formed of, for example, NiFeCr or Cr.

The fixed magnetic layer 21 may have a self-pinned structure composed of a first magnetic sub-layer 21a, a second magnetic sub-layer 21c, and a nonmagnetic intermediate sub-layer 21b disposed between the first magnetic sub-layer 21a and the second magnetic sub-layer 21c. As shown in FIG. 10, the fixed magnetization direction of the first magnetic sub-layer 21a and the fixed magnetization direction of the second magnetic sub-layer 21c are antiparallel. The fixed magnetization direction of the second magnetic sub-layer 21c is the fixed magnetization direction of the fixed magnetic layer 21, i.e., the sensitivity-axis direction.

As shown in FIG. 10, the first magnetic sub-layer 21a may be disposed on the seed layer 20. The second magnetic sub-layer 21c may be disposed so as to be in contact with a nonmagnetic material layer 22, which will be described below. The first magnetic sub-layer 21a may be made of, for example, a CoFe alloy having a coercive force higher than that of the second magnetic sub-layer 21c.

The second magnetic sub-layer 21c being in contact with the nonmagnetic material layer 22 contributes to the magnetoresistance effect (specifically, a GMR effect) and may be made of a magnetic material capable of increasing the mean free path difference between the up-spin and down-spin conduction electrons.

In the magnetoresistance effect element 11 shown in FIG. 10, the magnetization amounts (saturated magnetization Ms×layer thickness t) of the first magnetic sub-layer 21a and the second magnetic sub-layer 21c may be adjusted to be substantially equal to each other.

The fixed magnetic layer 21 of the magnetoresistance effect element 11 shown in FIG. 10 is of a self-pinned structure and therefore does not include any antiferromagnetic layer. Consequently, the temperature characteristics of the magnetoresistance effect element 11 are not restricted by the blocking temperature of an antiferromagnetic layer.

In order to enhance the magnetization fixing power of the fixed magnetic layer 21, it is important to increase the coercive force Hc of the first magnetic sub-layer 21a, to adjust the magnetization amounts of the first magnetic sub-layer 21a and the second magnetic sub-layer 21c to be substantially equal to each other, and to enhance the antiparallel coupling magnetic field due to RKKY interaction caused between the first magnetic sub-layer 21a and the second magnetic sub-layer 21c by controlling the thickness of the nonmagnetic intermediate sub-layer 21b. Such appropriate adjustment further rigidly fixes the magnetization, while the fixed magnetic layer 21 from being affected by outside magnetic fields.

The nonmagnetic material layer 22 may be made of, for example, copper (Cu).

The free magnetic layer 33 of the magnetoresistance effect element 11 shown in FIG. 10 may be composed of a ferromagnetic sub-layer 33a and a misfit-reducing sub-layer 33b. The ferromagnetic sub-layer 33a has a monolayer structure or a layered structure of a ferromagnetic material, such as NiFe or CoFe, and is exchange coupled to the first antiferromagnetic layer 24 together with the misfit-reducing sub-layer 33b.

The misfit-reducing sub-layer 33b reduces the lattice mismatch of the free magnetic layer 33 with the first antiferromagnetic layer 24. In the magnetoresistance effect element 11, the misfit-reducing sub-layer 33b may be disposed so as to be in contact with the first antiferromagnetic layer 24.

The lattice mismatch of a free magnetic layer with a first antiferromagnetic layer will be described using an example in which the material constituting the free magnetic layer contains NiFe and the material constituting the first antiferromagnetic layer is IrMn. The X-ray diffraction spectrum of a layered product consisting of the free magnetic layer containing NiFe and the first antiferromagnetic layer made of IrMn has a peak based on the fcc(111) plane of the free magnetic layer at approximately 51.5° and a peak based on the fcc(111) plane of the first antiferromagnetic layer at approximately 48.5°. The lattice spacings calculated based on these measurement results are 2.18 Å in the IrMn constituting the first antiferromagnetic layer and 2.06 Å in the NiFe constituting the free magnetic layer. The lattice mismatch is estimated to be about 6%.

In contrast, when the free magnetic layer 33 includes a misfit-reducing sub-layer 33b as in the magnetoresistance effect element 11, in the X-ray diffraction spectrum of a layered product consisting of the free magnetic layer 33 and the first antiferromagnetic layer 24 made of IrMn, the peak based on the free magnetic layer 33 shifts to the lower-angle side to reduce the lattice mismatch between the free magnetic layer 33 and the first antiferromagnetic layer 24. The magnetoresistance effect element 11, in one example, such that the lattice spacing of the misfit-reducing sub-layer 33b is larger than that of the ferromagnetic sub-layer 33a. The lattice mismatch between the free magnetic layer 33 and the first antiferromagnetic layer 24 is probably reduced by that since the lattice spacing of the misfit-reducing sub-layer 33b is larger than that of the ferromagnetic sub-layer 33a, the lattice spacing of the free magnetic layer 33 including the misfit-reducing sub-layer 33b and the ferromagnetic sub-layer 33a is increased to approach the lattice spacing of the first antiferromagnetic layer 24. Thus, the lattice spacing of the fcc(111) plane of the misfit-reducing sub-layer 33b in one example is larger than the lattice spacing of the fcc(111) plane of the ferromagnetic sub-layer 33a.

Such a reduction in the lattice mismatch between the free magnetic layer 33 and the first antiferromagnetic layer 24 prevents the decrease in the detection sensitivity, due to storage under a high temperature environment for a long time, of the magnetometric sensor 1 comprising the magnetoresistance effect element 11, compared to a case of having large lattice mismatch.

The detection sensitivity of the magnetometric sensor 1 stored under a high temperature environment for a long time is prevented from decreasing by a reduction in the lattice mismatch between the free magnetic layer 33 and the first antiferromagnetic layer 24 probably by that an increase in the lattice matching property of the free magnetic layer 33 with the first antiferromagnetic layer 24 hinders the atoms contained in the first antiferromagnetic layer 24 from moving, resulting in a decrease in the variation of the exchange coupling magnetic field due to storage under a high temperature environment for a long time.

The misfit-reducing sub-layer 33b may have any composition that can contribute to a reduction in the lattice mismatch between the free magnetic layer 33 and the first antiferromagnetic layer 24 and is preferably contains a material having an atomic radius larger than that of the material constituting the ferromagnetic sub-layer 33a. The misfit-reducing sub-layer 33b may have a monolayer structure or a layered structure. When the ferromagnetic sub-layer 33a is made of NiFe or CoFe and the first antiferromagnetic layer 24 is made of IrMn or PtMn, the misfit-reducing sub-layer 33b may comprise a first sub-layer containing at least one iron group element (specifically, for example, Fe, Ni, and Co) and at least one platinum group element (specifically, for example, Pt, Pd, Rh, Ir, Ru, and Os). Examples of the first sub-layer include those made of NiFePt. The lattice spacing of the fcc(111) plane of Pt is 2.26 Å. When the first antiferromagnetic layer 24 is made of IrMn as described above, the lattice spacing of the fcc(111) plane of the first antiferromagnetic layer 24 is approximately 2.18 Å. Accordingly, when the misfit-reducing sub-layer 33b includes a first sub-layer containing a platinum group element, such as Pt, together with an iron group element, the lattice spacing of the fcc(111) plane of the misfit-reducing sub-layer 33b increases with the content of the platinum group element, leading to an increase in the lattice spacing of the fcc(111) plane of the free magnetic layer 33.

The relationship between the content of the iron group element and the content of the platinum group element in the first sub-layer is not limited as long as, as described above, the lattice spacing of the fcc(111) plane of the free magnetic layer 33 is increased and the free magnetic layer 33 can have appropriate magnetic characteristics, specifically, an exchange coupling is appropriately caused between the free magnetic layer 33 and the first antiferromagnetic layer 24. As described in the examples below, an increase in the content of the platinum group element in the first sub-layer can reduce the lattice mismatch between the fcc(111) plane of the free magnetic layer 33 comprising the first sub-layer and the fcc(111) plane of the first antiferromagnetic layer 24 made of IrMn. At the same time, however, an increase in the content of the platinum group element in the first sub-layer may reduce the saturated magnetization Ms (unit: T) of the free magnetic layer 33. In such a case, an excessive content of the platinum group element in the first sub-layer prevents appropriate generation of an exchange coupling bias in the free magnetic layer 33.

The misfit-reducing sub-layer 33b may have any thickness that can contribute to a reduction in the lattice mismatch between the free magnetic layer 33 and the first antiferromagnetic layer 24. An excessively thin misfit-reducing sub-layer 33b cannot reduce the lattice mismatch between the free magnetic layer 33 and the first antiferromagnetic layer 24, whereas an excessively thick misfit-reducing sub-layer 33b enhances a risk of inappropriate generation of an exchange coupling bias in the free magnetic layer 33. In consideration of these characteristics, the thickness of the misfit-reducing sub-layer 33b may be appropriately determined. When the ferromagnetic sub-layer 33a is made of NiFe or CoFe, the first antiferromagnetic layer 24 is made of IrMn or PtMn, and the misfit-reducing sub-layer 33b is made of NiFePt, the misfit-reducing sub-layer 33b may have a thickness of 10 Å or more and 100 Å or less.

The protective layer 25 may be made of any material. An example of the material is tantalum (Ta). The magnetization direction F, shown in FIG. 10, of the free magnetic layer 33 of the magnetoresistance effect element 11 is the initial magnetization direction. The magnetization direction F of the free magnetic layer 33 is aligned to be orthogonal to the fixed magnetization direction of the fixed magnetic layer 21 (the fixed magnetization direction of the second magnetic sub-layer 21c).

In the magnetoresistance effect element 11 shown in FIG. 10, although the first antiferromagnetic layer 24 is formed on the whole upper surface of the free magnetic layer 23, the first antiferromagnetic layer 24 is not limited thereto and may be discontinuously formed on the upper surface of the free magnetic layer 33. However, a first antiferromagnetic layer 24 formed on the whole surface of the free magnetic layer 33 can appropriately make the whole free magnetic layer 33 into a single magnetic domain in one direction and can further reduce the hysteresis, leading to an improvement in the measurement accuracy.

In the magnetoresistance effect element 11 shown in FIG. 10, the fixed magnetic layer 21 has a self-pinned structure, but is not limited thereto. For example, as in the magnetoresistance effect element 11' shown in FIG. 11, the fixed magnetic layer 21 may have a layered structure composed of a second antiferromagnetic sub-layer 21d and a ferromagnetic sub-layer 21e such that the fixed magnetic layer 21 is magnetized through the magnetization of the ferromagnetic sub-layer 21e in a specific direction (in FIG. 11, in the direction toward the rear side of the paper in the direction normal to the plane of the paper) by exchange coupling of the ferromagnetic sub-layer 21e with the second antiferromagnetic sub-layer 21d.

The magnetometric sensor according to the above-described embodiment may be produced by any process. For example, a seed layer 20 is formed on a substrate 29 provided with an insulating layer (not shown in FIG. 10), and a fixed magnetic layer 21 having a self-pinned structure is stacked on the seed layer 20. Specifically, as shown in FIG. 10, a first magnetic sub-layer 21a, a nonmagnetic intermediate sub-layer 21b, and a second magnetic sub-layer 21c are sequentially stacked. These layers may be formed by sputtering, but may be formed by any method. When the first magnetic sub-layer 21a is formed under application of a magnetic field such that the first magnetic sub-layer 21a is magnetized along the width direction D2 in FIG. 9, the second magnetic sub-layer 21c can be strongly magnetized in the direction antiparallel to the magnetization direction of the first magnetic sub-layer 21a by means of RKKY interaction. The thus-magnetized second magnetic sub-layer 21c can maintain the state of being magnetized in the width direction D2 even if a magnetic field in a direction different from the magnetization direction of the second magnetic sub-layer 21c itself is applied during the subsequent production procedure.

Subsequently, a nonmagnetic material layer 22 may be stacked on the fixed magnetic layer 21. The nonmagnetic material layer 22 may be formed by sputtering, but may be formed by any method.

Subsequently, a free magnetic layer 33, a first antiferromagnetic layer 24, and a protective layer 25 may be sequentially stacked on the nonmagnetic material layer 22 under application of a magnetic field along the longitudinal direction D1. These layers may be formed by sputtering, but may be formed by any method. By forming the layers in a magnetic field, an exchange coupling bias is caused between the free magnetic layer 33 and the first antiferromagnetic layer 24 along the magnetization direction of the free magnetic layer 33. During the formation of these layers, although the magnetic field is also applied to the fixed magnetic layer 21, the magnetization direction of the fixed magnetic layer 21 is not varied by this applied magnetic field, since the fixed magnetic layer 21 has a pinned structure formed by the RKKY interaction. When the misfit-reducing sub-layer 33b of the free magnetic layer 33 includes a first sub-layer made of, for example, NiFePt, formed by simultaneous deposition of an iron group element and a platinum group element, the alloy composition of the first sub-layer can be adjusted by regulating the deposition rate (for example, sputtering rate) of the iron group element and the deposition rate (for example, sputtering rate) of the platinum group element.

When the first antiferromagnetic layer 24 is made of an IrMn-based material, the magnetization direction of the first antiferromagnetic layer 24 can be aligned by film formation in a magnetic field not accompanied by particular heat treatment. Accordingly, it is possible not to perform annealing in a magnetic field throughout the whole process of producing the magnetoresistance effect element 11. As described above, the annealing-free process in a magnetic field can easily produce magnetoresistance effect elements 11 having different sensitivity axes (including the cases of magnetization in opposite directions) on a single substrate 29. In a process of producing a magnetoresistance effect element 11 including a step of annealing in a magnetic field, if the annealing in a magnetic field is repeated multiple times, the effect of annealing in a magnetic field may be weakened by the subsequent annealing in a magnetic field, leading to a difficulty in appropriate alignment of the magnetization direction.

After the formation of the free magnetic layer 33 and the first antiferromagnetic layer 24 in a magnetic field, a protective layer 25 may be finally stacked. The protective layer 25 is typically formed by sputtering, but may be formed by any method.

The layered structure prepared by the process described above may be subjected to removal processing (milling) and may be formed into a plurality of longitudinal patterns 12 arranged along the width direction D2. Conductive parts 13 connecting the longitudinal patterns 12 are formed, and connecting terminals 14 are connected to the respective conductive parts 13 to give a magnetoresistance effect element 11 having a meander shape shown in FIG. 9.

The magnetometric sensor comprising the magnetoresistance effect element according to the above-described embodiment can be suitably used as a current sensor. Such a current sensor may include four magnetoresistance effect elements forming a bridge circuit to enhance the measurement accuracy as described in Japanese Unexamined Patent Application Publication No. 2012-185044, although the current sensor may comprise a single magnetoresistance effect element. An example method of producing a magnetoresistance effect element does not include a step of annealing in a magnetic field and therefore can easily produce a plurality of magnetoresistance effect elements on a single substrate.

Examples of the current sensor according to the above-described embodiment include a magnetic proportional current sensor and a magnetic balance current sensor.

The magnetic proportional current sensor includes at least one magnetoresistance effect element according to the above-described embodiment (a magnetoresistance effect element having a layered structure composed of a fixed magnetic layer and a free magnetic layer stacked with a nonmagnetic material layer interposed therebetween and including a first antiferromagnetic layer on the free magnetic layer on the opposite side to the side facing the nonmagnetic material layer to cause an exchange coupling bias between the first antiferromagnetic layer and the free magnetic layer and align the magnetization direction of the free magnetic layer in a prescribed direction in a state of permitting variation in magnetization, wherein the free magnetic layer includes a misfit-reducing sub-layer being in contact with the first antiferromagnetic layer and decreasing the lattice mismatch of the free magnetic layer with the first antiferromagnetic layer and a ferromagnetic sub-layer of a ferromagnetic material disposed on the opposite side to the side facing the first antiferromagnetic layer; or a magnetoresistance effect element having a layered structure composed of a fixed magnetic layer and a free magnetic layer stacked with a nonmagnetic material layer interposed therebetween and including a first antiferromagnetic layer on the free magnetic layer on the opposite side to the side facing the nonmagnetic material layer to cause an exchange coupling bias between the first antiferromagnetic layer and the free magnetic layer and align the magnetization direction of the free magnetic layer in a prescribed direction in a state of permitting variation in magnetization, wherein the free magnetic layer includes a first sub-layer containing at least one iron group element and at least one platinum group element and being in contact with the first antiferromagnetic layer and a ferromagnetic sub-layer of a ferromagnetic material disposed on the first sub-layer on the opposite side to the side facing the first antiferromagnetic layer), and the magnetic proportional current sensor includes a magnetic field detecting bridge circuit having two outputs for generating a potential difference according to the induced magnetic field from a current to be measured. The magnetic proportional current sensor measures a current based on the difference in the potentials output from the magnetic field detecting bridge circuit according to the induced magnetic field.

The magnetic balance current sensor includes at least one magnetoresistance effect element according to the above-described embodiment and a magnetic field detecting bridge circuit having two outputs for generating a potential difference according to the induced magnetic field from a current to be measured and a feedback coil disposed near the magnetoresistance effect element and generating a cancellation magnetic field that cancels out the induced magnetic field. In the magnetic balance current sensor, the feedback coil is energized with the potential difference, and the current to be measured is measured based on the current flowing in the feedback coil when the induced magnetic field and the cancellation magnetic field cancel each other out into an equilibrium state.

Figure 11:
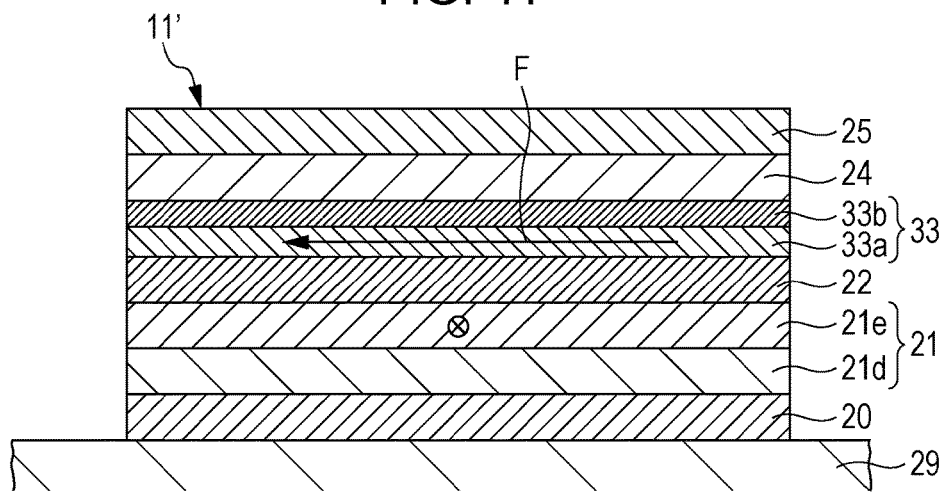
FIG. 11 is a cross-sectional view taken along the line X-X in FIG. 9 when the magnetoresistance effect element constituting a magnetometric sensor shown in FIG. 9 includes a fixed magnetic layer of an exchange coupling type instead of a self-pinned type.

Referring now to FIGS. 10 and 11, for example, although FIGS. 10 and 11 show magnetoresistance effect elements 11 and 11' that are each of a bottom pin structure having the fixed magnetic layer 21 between the free magnetic layer 23 and the substrate 29, the magnetoresistance effect element of the present invention may be of a top pin structure having a free magnetic layer between a fixed magnetic layer and a substrate.

A seed layer of NiFeCr (42), a fixed magnetic layer of [first magnetic sub-layer of $Co_{40}Fe_{60}$ (19)/nonmagnetic intermediate sub-layer of Ru (3.6)/second magnetic sub-layer of $Co_{90}Fe_{10}$ (24)], a nonmagnetic material layer of Cu (22), a free magnetic layer of [$Co_{90}Fe_{10}$ (10)/$Ni_{82.5}Fe_{17.5}$ (70)], an antiferromagnetic layer of $Ir_{22}Mn_{78}$ (80), and a protective layer of Ta (100) were sequentially stacked in this order from the bottom to the top on a substrate provided with an insulating film to form a first comparative layered structure. The figures in parentheses each denote the layer thickness, and their unit is Å.

(X-Ray Diffraction Measurement)

Figure 12:
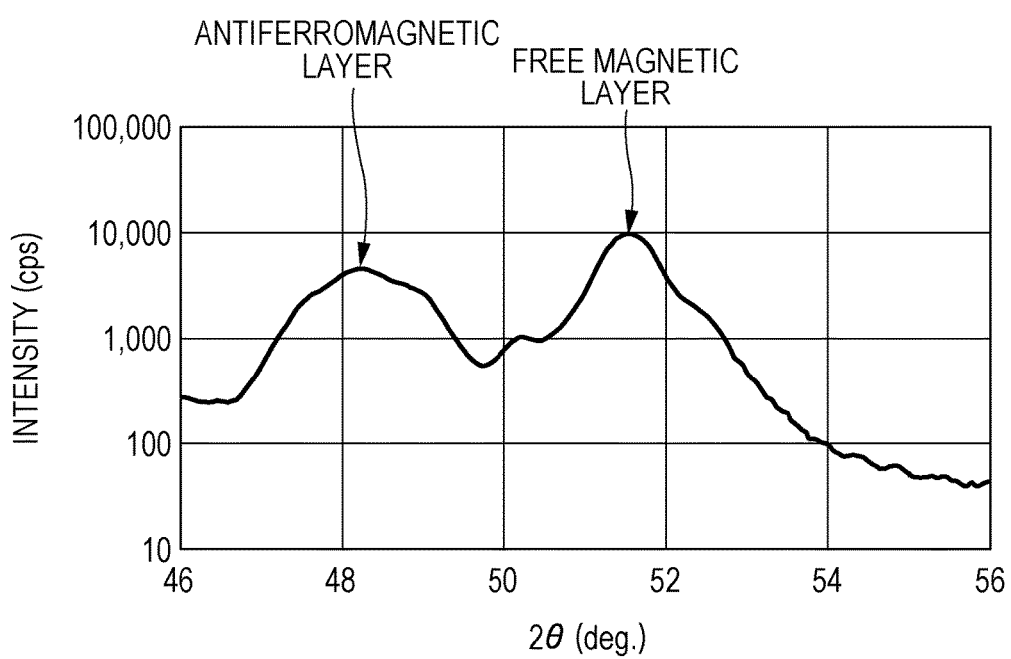
FIG. 12 is an X-ray diffraction spectrum (2θ: 46° to 56°) of a first comparative layered structure.

The X-ray diffraction of the first comparative layered structure was measured. The X-ray source used was CoKα ray (λ=1.789 Å). The results (2θ: 46° to 56°) are shown in FIG. 12. As shown in FIG. 12, a peak was observed near 48.5°. This peak was based on the fcc(111) plane of the antiferromagnetic layer, and the lattice spacing calculated was 2.18 Å. A peak was also observed near 51.5°. This peak was based on the fcc(111) plane of the free magnetic layer, and the lattice spacing calculated was 2.06 Å. The lattice mismatch based on these calculated lattice spacings was 6%.

For example, a seed layer 20 of NiFeCr (42), a fixed magnetic layer 21 of [first magnetic sub-layer 21a of $Co_{40}Fe_{60}$ (19)/nonmagnetic intermediate sub-layer 21b of Ru (3.6)/second magnetic sub-layer 21c of $Co_{90}Fe_{10}$ (24)], a nonmagnetic material layer 22 of Cu (22), a free magnetic layer 33 of [ferromagnetic sub-layer 33a of ($Co_{90}Fe_{10}$ (10)/$Ni_{82.5}Fe_{17.5}$ (40))/misfit-reducing sub-layer 33b of $Ni_{65}Fe_{15}Pt_{20}$(30)], a first antiferromagnetic layer 24 of $Ir_{22}Mn_{78}$ (80), and a protective layer 25 of Ta (100) were sequentially stacked in this order from the bottom to the top on a substrate 29 provided with an insulating film to form a first layered structure. The figures in parentheses each denote the layer thickness, and their unit is Å. The misfit-reducing sub-layer 33b of the first layered structure was also defined as a layer containing at least one iron group element (specifically, Ni and Fe) and at least one platinum group element (specifically, Pt) and was therefore also regarded as a first sub-layer.

(High Temperature Storage Test)

Figure 13:
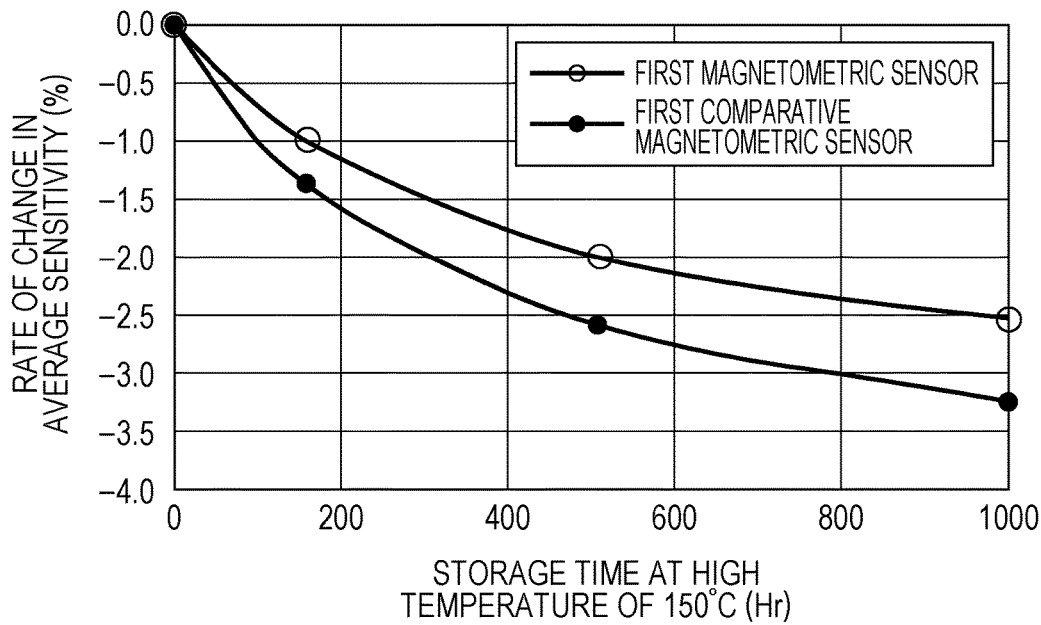
FIG. 13 is a graph showing the changes in average sensitivity of a first magnetometric sensor and a first comparative magnetometric sensor caused by the storage under an environment of 150° C. for a predetermined time.

A magnetometric sensor comprising the first comparative layered structure and a magnetometric sensor comprising the first layered structure (referred to as "first comparative magnetometric sensor" and "first magnetometric sensor", respectively) were produced. The magnetometric sensors were each stored under an environment of 150° C. for a predetermined time, and the changes in average sensitivity caused by the storage were measured. The measurement results are shown in FIG. 13. As shown in FIG. 13, the change in average sensitivity of the first magnetometric sensor stored under a high temperature environment for a long time was smaller than that of the first comparative magnetometric sensor.

Example 2

Second layered structures were produced as in Example 1 except that the misfit-reducing sub-layer 33b was a layer (thickness: 30 Å) of $Ni_{81.5\times(1-\alpha)}Fe_{18.5\times(1-\alpha)}Pt_{100\times\alpha}$ (α denotes 0.1, 0.2, 0.3, 0.4, or 0.5). The misfit-reducing sub-layer 33b of each second layered structure was also defined as a layer containing at least one iron group element (specifically, Ni and Fe) and at least one platinum group element (specifically, Pt) and was therefore also regarded as a first sub-layer.

(X-Ray Diffraction Measurement)

Figure 14:
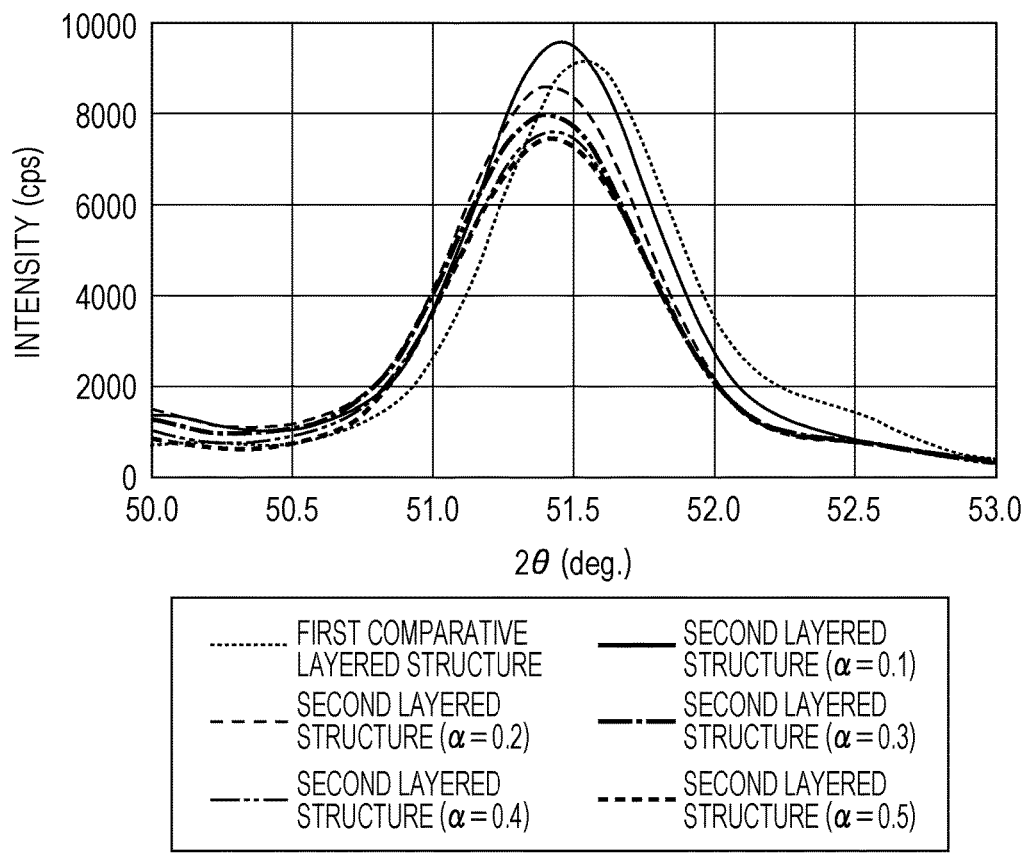
FIG. 14 is X-ray diffraction spectra (2θ: 50.0° to 53.0°) of a first comparative layered structure and second layered structures.

The X-ray diffractions of the first comparative layered structure and the second layered structures were measured. The X-ray source used was CoKα ray (λ=1.789 Å). The results (2θ: 50.0° to 53.0°) are shown in FIG. 14. As shown in FIG. 14, the peaks based on the fcc(111) plane of the free magnetic layer 33 of each second layered structure shifted to the lower-angle side than the peak based on the fcc(111) plane of the free magnetic layer of the first comparative layered structure.

Figure 15:
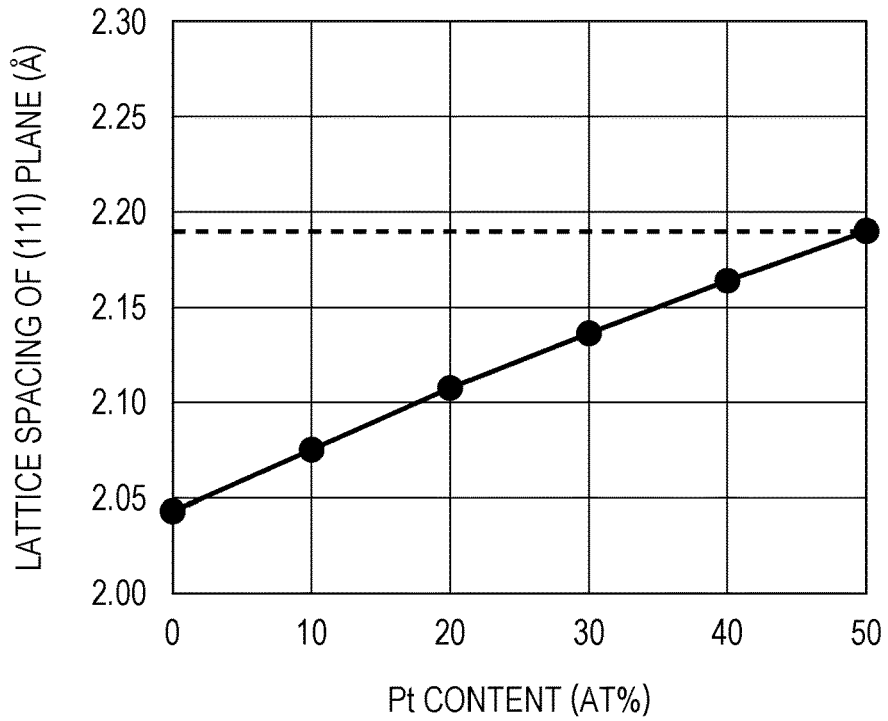
FIG. 15 is a graph showing a relationship between the lattice spacing (unit: Å) of the (111) plane of a monolayer (thickness: 300 Å) made of the same material as that for the misfit-reducing sub-layer 33b and the Pt content (unit: at %) of the monolayer (when the Pt content is 0 at %, the monolayer is a $Ni_{81.5}Fe_{18.5}$ layer)

Monolayers (thickness: 300 Å) were formed of the same material as that for the misfit-reducing sub-layer 33b. The peak based on the (111) plane of each monolayer was determined, and the lattice spacing (unit: Å) was calculated from the peak. FIG. 15 is a graph showing the calculation results. The horizontal axis of FIG. 15 indicates the Pt content (unit: at %) in the monolayer (when the Pt content is 0 at %, the monolayer is a $Ni_{81.5}Fe_{18.5}$ layer). FIG. 15 demonstrates that the lattice spacing increases with the Pt content in the monolayer made of the same material as that for the misfit-reducing sub-layer 33b and that the lattice spacing when the Pt content is 50 at % (α=0.5) is substantially equal to the lattice spacing of the (111) plane of an IrMn layer (lattice spacing: 2.19 Å, indicated with a broken line in FIG. 15). The results shown in FIG. 15 demonstrate that the lattice mismatch between the free magnetic layer 33 and the first antiferromagnetic layer 24 can be controlled by introducing a misfit-reducing sub-layer 33b into the free magnetic layer 33 and adjusting the composition of the misfit-reducing sub-layer 33b.

(Measurement of Saturated Magnetization Ms)

Figure 16:
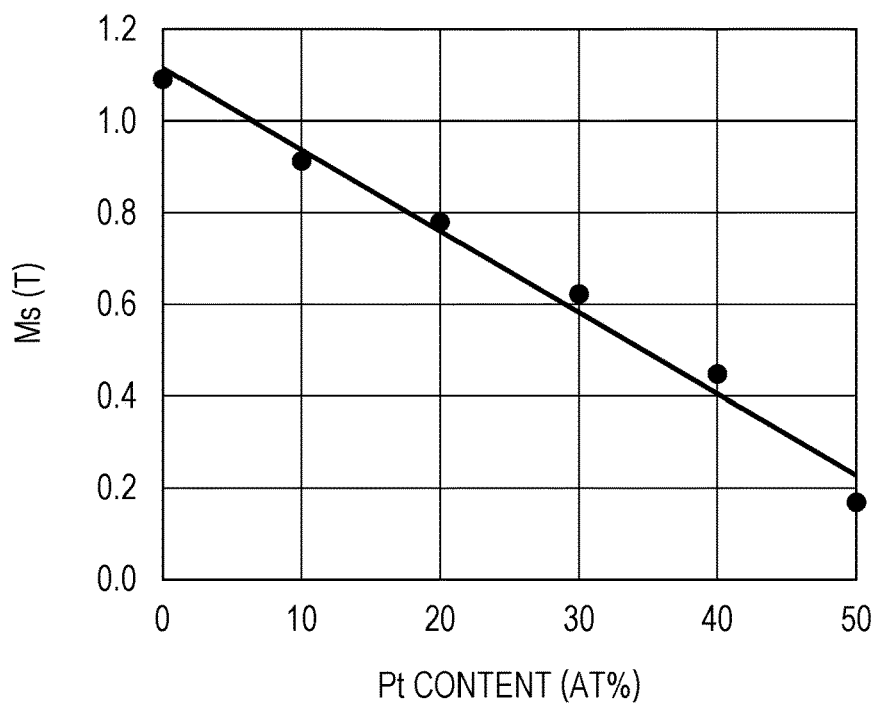
FIG. 16 is a graph showing a relationship between the saturated magnetization Ms (unit: T) of a monolayer (thickness: 300 Å) made of the same material as that for the misfit-reducing sub-layer 33b and the Pt content (unit: at %) of the monolayer (when the Pt content is 0 at %, the monolayer is a $Ni_{81.5}Fe_{18.5}$ layer).

The saturated magnetization Ms (unit: T) of each monolayer (thickness: 300 Å) made of the same material as that for the misfit-reducing sub-layer 33b was measured with a vibrating sample magnetometer (VSM, ±7958 A/m). The measurement results are shown in FIG. 16. The horizontal axis of FIG. 16 indicates the Pt content (unit: at %) in the monolayer (when the Pt content is 0 at %, the monolayer is a $Ni_{81.5}Fe_{18.5}$ layer). FIG. 16 demonstrates that the saturated magnetization Ms of the monolayer approximately linearly decreases with an increase in the Pt content in the monolayer made of the same material as that for the misfit-reducing sub-layer 33b.

The magnetometric sensor comprising the magnetoresistance effect element according to the present invention can be suitably used as a component of a current sensor of, for example, an electric vehicle or a hybrid car.

Accordingly, the embodiments of the present inventions are not to be limited in scope by the specific embodiments described herein. Further, although some of the embodiments of the present disclosure have been described herein in the context of a particular implementation in a particular environment for a particular purpose, those of ordinary skill in the art should recognize that its usefulness is not limited thereto and that the embodiments of the present inventions can be beneficially implemented in any number of environments for any number of purposes. Accordingly, the claims set forth below should be construed in view of the full breadth and spirit of the embodiments of the present inventions as disclosed herein. While the foregoing description includes many details and specificities, it is to be understood that these have been included for purposes of explanation only, and are not to be interpreted as limitations of the invention. Many modifications to the embodiments described above can be made without departing from the spirit and scope of the invention.

What is claimed is:

1. A magnetometric sensor comprising:
   a magnetoresistance effect element having a sensitivity axis in a specific direction, wherein
   the magnetoresistance effect element has a layered structure on a substrate, the layered structure comprising a fixed magnetic layer and a free magnetic layer stacked with a nonmagnetic material layer interposed therebetween;
   the magnetoresistance effect element includes a first antiferromagnetic layer on the free magnetic layer on the opposite side to the side facing the nonmagnetic material layer to cause an exchange coupling bias between the first antiferromagnetic layer and the free magnetic layer to make the magnetization direction of the free magnetic layer in a prescribed direction in a state of permitting variation in magnetization; and
   the free magnetic layer includes a misfit-reducing sub-layer for decreasing the lattice mismatch of the free magnetic layer with the first antiferromagnetic layer.

2. The magnetometric sensor according to claim 1, wherein the free magnetic layer includes:
   a misfit-reducing sub-layer for decreasing the lattice mismatch of the free magnetic layer with the first antiferromagnetic layer;
   a first free magnetic sub-layer disposed between the misfit-reducing sub-layer and the nonmagnetic material layer; and
   a second free magnetic sub-layer disposed between the misfit-reducing sub-layer and the first antiferromagnetic layer and ferromagnetically coupled to the first free magnetic sub-layer.

3. The magnetometric sensor according to claim 2, wherein
   the misfit-reducing sub-layer and the second free magnetic sub-layer each have a face-centered cubic (fcc) structure; and
   the lattice spacing of the fcc(111) plane of the misfit-reducing sub-layer is larger than that of the fcc(111) plane of the second free magnetic sub-layer.

4. The magnetometric sensor according to claim 2, wherein the misfit-reducing sub-layer contains at least one selected from the group consisting of Pt, Pd, Ta, and W.

5. The magnetometric sensor according to claim 2, wherein
   the first antiferromagnetic layer contains a platinum group element and Mn.

6. The magnetometric sensor according to claim 2, wherein
   the first antiferromagnetic layer is formed of at least one of IrMn and PtMn.

7. The magnetometric sensor according to claim 2, wherein
   the fixed magnetic layer includes a first magnetic sub-layer and a second magnetic sub-layer stacked with a nonmagnetic intermediate sub-layer interposed therebetween, the second magnetic sub-layer being in contact with the nonmagnetic material layer, wherein
   the first magnetic sub-layer and the second magnetic sub-layer are self-pinned magnetic layers having magnetization fixed in mutually antiparallel directions.

8. The magnetometric sensor according to claim 2, wherein
   the fixed magnetic layer includes a second antiferromagnetic sub-layer on the opposite side to the side facing the nonmagnetic material layer and a ferromagnetic sub-layer to cause an exchange coupling bias between the second antiferromagnetic sub-layer and the ferromagnetic sub-layer and align the magnetization direction of the fixed magnetic layer in a prescribed direction.

9. The magnetometric sensor according to claim 2, wherein
   the layered structure has the free magnetic layer between the fixed magnetic layer and the substrate.

10. The magnetometric sensor according to claim 2, wherein
    the layered structure has the fix magnetic layer between the free magnetic layer and the substrate.

11. A current sensor comprising the magnetometric sensor according to claim 2.

12. The magnetometric sensor according to claim 1, wherein
    the free magnetic layer includes:
    a misfit-reducing sub-layer being in contact with the first antiferromagnetic layer and decreasing the lattice mismatch of the free magnetic layer with the first antiferromagnetic layer; and
    a ferromagnetic sub-layer made of a ferromagnetic material disposed on the misfit-reducing sub-layer on the opposite side to the side facing the first antiferromagnetic layer.

13. The magnetometric sensor according to claim 12, wherein
    the misfit-reducing sub-layer and the ferromagnetic sub-layer each have a face-centered cubic (fcc) structure; and
    the lattice spacing of the fcc(111) plane of the misfit-reducing sub-layer is larger than that of the fcc(111) plane of the ferromagnetic sub-layer.

14. The magnetometric sensor according to claim 12, wherein
    the misfit-reducing sub-layer contains at least one iron group element and at least one platinum group element.

15. A current sensor comprising the magnetometric sensor according to claim 12.

16. A current sensor comprising the magnetometric sensor according to claim 1.

17. A magnetometric sensor comprising:
    a magnetoresistance effect element having a sensitivity axis in a specific direction, wherein
    the magnetoresistance effect element includes:
    a layered structure on a substrate, the layered structure comprising a fixed magnetic layer and a free magnetic layer stacked with a nonmagnetic material layer interposed therebetween; and
    a first antiferromagnetic layer on the free magnetic layer on the opposite side to the side facing the nonmagnetic material layer to cause an exchange coupling bias between the first antiferromagnetic layer and the free magnetic layer and align the magnetization direction of the free magnetic layer in a prescribed direction in a state of permitting variation in magnetization, wherein
    the free magnetic layer includes:
    a first sub-layer serving as a misfit-reducing sub-layer for decreasing the lattice mismatch of the free magnetic layer with the first antiferromagnetic layer;
    a first free magnetic sub-layer disposed between the first sub-layer and the nonmagnetic material layer; and
    a second free magnetic sub-layer disposed between the first sub-layer and the first antiferromagnetic layer and ferromagnetically coupled to the first free magnetic sub-layer, wherein the first sub-layer contains at least one selected from the group consisting of Pt, Pd, Ta, and W.

18. A current sensor comprising the magnetometric sensor according to claim 17.

19. A magnetometric sensor comprising:

a magnetoresistance effect element having a sensitivity axis in a specific direction, wherein the magnetoresistance effect element has a layered structure on a substrate, the layered structure comprising a fixed magnetic layer and a free magnetic layer stacked with a nonmagnetic material layer interposed therebetween;

the magnetoresistance effect element includes a first antiferromagnetic layer on the free magnetic layer on the opposite side to the side facing the nonmagnetic material layer to cause an exchange coupling bias between the first antiferromagnetic layer and the free magnetic layer and align the magnetization direction of the free magnetic layer in a prescribed direction in a state of permitting variation in magnetization;

the free magnetic layer includes:

a first sub-layer being in contact with the first antiferromagnetic layer and serving as a misfit-reducing sub-layer for decreasing the lattice mismatch of the free magnetic layer with the first antiferromagnetic layer; and a ferromagnetic sub-layer made of a ferromagnetic material disposed on the first sub-layer on the opposite side to the side facing the first antiferromagnetic layer, wherein the first sub-layer contains at least one iron group element and at least one platinum group element.

20. A current sensor comprising the magnetometric sensor according to claim 19.

* * * * *

UNITED STATES PATENT AND TRADEMARK OFFICE
CERTIFICATE OF CORRECTION

PATENT NO.           : 10,184,993 B2
APPLICATION NO.      : 15/018989
DATED                : January 22, 2019
INVENTOR(S)          : Yosuke Ide and Masamichi Saito Page 1 of 1

It is certified that error appears in the above-identified patent and that said Letters Patent is hereby corrected as shown below:

On the Title Page

The (71) applicant name should be corrected from:
ALPS ELECTRIC CO., LTD., Tokyo (JP)
To:
ALPS ALPINE CO., LTD., Tokyo (JP)

Signed and Sealed this
Thirtieth Day of April, 2019

Andrei Iancu
*Director of the United States Patent and Trademark Office*